(12) United States Patent
Kishiro

(10) Patent No.: US 7,144,746 B2
(45) Date of Patent: Dec. 5, 2006

(54) METHOD FOR MONITORING IMPLANTATION DEPTH OF IMPURITY

(75) Inventor: Koichi Kishiro, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/213,848

(22) Filed: Aug. 30, 2005

(65) Prior Publication Data
US 2006/0189008 A1 Aug. 24, 2006

(30) Foreign Application Priority Data
Feb. 21, 2005 (JP) ............... 2005/044194

(51) Int. Cl.
H01L 21/66 (2006.01)
H01L 21/469 (2006.01)
H01L 21/425 (2006.01)

(52) U.S. Cl. ............ 438/14; 438/527; 438/530; 438/765; 438/766

(58) Field of Classification Search ............ 438/14, 438/17, 18, 527, 530, 765–766
See application file for complete search history.

(56) References Cited

U.S. PATENT DOCUMENTS

| | | | |
|---|---|---|---|
| 3,897,276 A | * | 7/1975 | Kondo ............ 438/527 |
| 5,604,150 A | * | 2/1997 | Mehrad ............ 438/257 |
| 5,882,947 A | * | 3/1999 | Lin et al. ............ 438/14 |
| 6,867,055 B1 | | 3/2005 | Song |
| 2005/0142671 A1 | * | 6/2005 | Wu et al. ............ 438/14 |

FOREIGN PATENT DOCUMENTS

JP 2003-151913 5/2003

* cited by examiner

Primary Examiner—Luan Thai
(74) Attorney, Agent, or Firm—VolentineFrancos& Whitt,PLLC

(57) ABSTRACT

The present invention provides a method for measuring an implantation depth of an impurity injected into a wafer by an ion implantation device, using a measurement device and monitoring whether the measured implantation depth of impurity falls within an allowable range, comprising the steps of using, as a measuring wafer, a wafer having an insulating film and an Si layer formed on the insulating film with a thickness of a 1000 Å unit or less; implanting the impurity in the measuring wafer from above the surface of the Si layer, corresponding to a main surface of the measuring wafer and heat-treating the measuring wafer; and measuring surface resistivity of the main surface of the heat-treated measuring wafer by the measurement device and detecting, as an implantation depth of the impurity from the main surface, a concentration peak depth from the main surface, which corresponds to the surface resistivity and at which a concentration of the impurity implanted in the measuring wafer reaches a peak.

9 Claims, 11 Drawing Sheets

US 7,144,746 B2

METHOD FOR MONITORING IMPLANTATION DEPTH OF IMPURITY

BACKGROUND OF THE INVENTION

1. Field of the Invention

The present invention relates to a method for satisfactorily monitoring the depth of an impurity implanted in a wafer upon manufacture of a semiconductor device.

2. Description of the Related Art

Upon manufacture of a semiconductor device, an ion implantation device (not shown), which implants ion species (hereinafter called simply "impurity") of impurities such as phosphorous (P), Arsenic (As), Boron, etc., needs to implant an impurity to a depth, which is given at a distance measured from a main surface of the wafer on the execution side of ion implantation and which is as expressed in a predetermined set value.

However, when the ion implantation device continues to operate for a long period, it might implant an impurity to a depth different from the set value. Such a phenomenon principally takes place due to the fact that malfunctions occur in each part of the ion implantation device. Particularly when the impurity is accelerated so that needless discharge occurs in a part (hereinafter called acceleration part) injected into a wafer, injection energy E varies and hence such a phenomenon is apt to take place. There is a need to detect in early stages such a phenomenon because the characteristic of the wafer greatly varies when the thickness of a conductive layer of the wafer is thin in particular.

Thus, each semiconductor device maker has monitored the depth (hereinafter called "implantation depth") of an impurity implanted in a wafer in the following manner.

That is, upon fabrication of a semiconductor device, the ion implantation device being in operation is stopped on a regular basis to thereby introduce a measuring wafer for measuring the implantation depth of the impurity onto a production line in place of a manufacturing wafer provided for the manufacture of the semiconductor device, which has been introduced onto the production line till then. And each semiconductor device maker operates the ion implantation device again to effect processing to be described below with reference to FIG. 10 on the measuring wafer. Incidentally, the measuring wafer is a wafer in which in order to accurately measure the impurity implantation depth, the type of material for each layer constituting the wafer, and the accurate thickness of each layer have been determined in advance. The measuring wafer might be identical to or different from the manufacturing wafer in constitution.

FIG. 10 is a view for describing a processing process effected on a conventional measuring wafer. Respective process steps are shown in FIGS. 10A through 10C.

In the example shown in FIG. 10, a measuring wafer 10 has a configuration in which an oxide film (e.g., $SiO_2$) 14 is formed on a silicon wafer (hereinafter called "Si wafer") 12. Incidentally, a main surface of the measuring wafer 10 functions as an exposed upper surface 14a of the oxide film 14. An impurity 70 is implanted from above the upper surface 14a of the oxide film 14.

In the measuring wafer 10, the thickness of each layer has been determined in advance as mentioned above. In the present example, the thickness H of the Si wafer 12 is assumed to range from approximately 100 Å to 1000 Å units ($1 \times 10^3$ to $m \times 10^4$ Å) (where "l" and "m" are arbitrary integers), and the thickness h of the oxide film 14 is assumed to be about 100 Å. Incidentally, the Si wafer 12 is heat-treated after the impurity 70 has been implanted in the neighborhood of its surface. Thus, the neighborhood of the surface of the Si wafer 12 takes a diffused area of the impurity 70, thus resulting in a conductive layer. The oxide film 14 functions as a film for prevention of outward diffusion of the impurity 70.

The ion implantation device accelerates the impurity (P, for example) 70 at injection energy E and implants the accelerated impurity 70 in the measuring wafer 10 from above the upper surface 14a of the oxide film 14 (see FIG. 10A). Incidentally, the injection energy E is set in consideration of the thickness h of the oxide film 14 formed on the Si wafer 12 in such a manner that the impurity 70 is sufficiently implanted in the neighborhood of the surface of the Si wafer 12.

Each individual impurity 70 implanted in the measuring wafer 10 penetrates the oxide film 14 while its outward diffusion is being suppressed by the oxide film 14, and reaches the Si wafer 12. Each impurity 70 injected into the measuring wafer 10 collides with an internal crystal of the Si wafer 12, proceeds while being scattered, and stops at a point where the injection energy is used up (see FIG. 11). Incidentally, FIG. 11 is a view showing the process of intrusion of the impurity. At this time, if no malfunctions occur in respective parts (e.g., an acceleration part, etc.) of the ion implantation device, then most of the impurities 70 implanted in the measuring wafer 10 stop at a depth near a set value. If the malfunctions occur in the respective parts of the ion implantation device, then they stop at a depth different from the set value.

Thus, the ion implantation device forms an impurity-implanted layer 72 with the impurity 70 injected therein, in the vicinity of the surface of the Si wafer 12 (see FIG. 10B).

Incidentally, since the individual impurities 70 implanted in the measuring wafer 10 are affected by crystals in the measuring wafer 10, they are placed in a random order in the way of being diffused. Therefore, even though each individual impurity 70 is implanted at the same injection energy E, a variation width occurs in each stop position.

FIG. 12 is a view showing an impurity concentration profile. The horizontal axis of FIG. 12 indicates the concentration ($cm^{-3}$) of the impurity 70, and the vertical axis thereof indicates an implantation depth of the impurity 70 as viewed from the main surface of the wafer.

If no malfunctions occur in the respective parts of the ion implantation device as well known, then the impurity 70 is distributed in Gaussian distribution and protruded forms with a set value RP of an implantation depth as the center as shown in FIG. 12. Thus, if no malfunctions occur in the respective parts (e.g., an acceleration part, etc.) of the ion implantation device, then the concentration of the impurity 70 becomes the highest at the set value RP of the implantation depth and becomes low as it falls outside the set value RP of the implantation depth.

Incidentally, the depth Rp in FIG. 12 shows a depth (hereinafter called "concentration peak depth") at which the concentration of the impurity 70 at its actual measurement becomes the peak. Since no malfunctions occur in the respective parts of the ion implantation device in the example shown in FIG. 12, the concentration peak depth Rp coincides with the set value RP of the implantation depth. However, if the malfunctions occur in the respective parts of the ion implantation device, then the concentration peak depth Rp does not coincide with the set value RP of the implantation depth.

In FIG. 12, areas D with dots and a diagonally-shaped area S indicate areas set so as to become the impurity-implanted layer 72 shown in FIG. 10B in the Si wafer 12. The areas in the Si wafer 12, which are set so as to become the impurity-implanted layer 72, will hereinafter be called "target area" for implanting the impurity 70. The target area serves as the impurity-implanted layer 72 by the implantation of the impurity 70 therein. In the present example, upper and lower ends of the target area as taken in its depth direction are respectively set to a position where a concentration C1 of the impurity 70 reaches about 10% of a concentration Cp of the impurity 70 at the set value RP of the implantation depth. In FIG. 12, a depth Re1 shows the depth of the upper end of the target area, whereas a depth Re2 indicates the depth of the lower end of the target area. According to the conventional experiences, electric resistivity of each of external areas (i.e., an upper area shallower than the depth Re1 and a lower area deeper than the depth Re2) of the target area reaches ten or more times that of an internal area (i.e., an area below the depth Re1 and above the depth Re2) of the target area.

In FIG. 12, the diagonally-shaded area S indicates an area in which the impurity 70 is contained in a high concentration. This area S results in a conductive layer significant from a practical standpoint. In the present example, upper and lower ends of the area S as taken in its depth direction are respectively set to a position where a concentration C2 of the impurity 70 reaches about 50% of the concentration Cp of the impurity 70 at the set value RP of the implantation depth. According to the result of measurement, the area S normally results in an area which contains about ⅔ (about 68%) of the amount of the impurity 70 injected into the measuring wafer 10. As already mentioned above, variations occur in the implantation depth of the impurity 70. Therefore, the distance (i.e., the distance from the set value RP of the implantation depth to the upper end of the area S or the distance from the set value RP of the implantation depth to the lower end of the area S) from the set value RP of the implantation depth to the upper or lower end of the area S is taken as a width at which the impurity 70 varies in upper and lower depth directions with the set value RP of the implantation depth as the center. This is particularly referred to as a diffusion variation width ΔRp as viewed in the depth direction, of the impurity 70. Thus, the area S is brought to an area of (RP±ΔRp) with the set value RP of the implantation depth as the center.

If no malfunctions occur in the respective parts (especially, the acceleration part), then the concentration peak depth Rp and the diffusion variation width ΔRp are determined by the type of impurity 70, the dose of the impurity 70, the type of target intended for implantation of the impurity 70, and injection energy E. For example, the type of impurity 70 is assumed to be phosphorous (P), the dose of the impurity 70 is assumed to be $5 \times 10^{15} cm^{-2}$, the type of target intended for implantation of the impurity 70 is assumed to be of the Si wafer 12 (however, on condition that the number of defects on its surface is less than or equal to a predetermined value defined in advance), and the injection energy E is assumed to be 50 keV. At this time, according to the pre-executed result of measurement, the concentration peak depth Rp results in about 600 Å and the diffusion variation width ΔRp results in about 280 Å. However, if the malfunctions occur in the respective parts of the ion implantation device, then the concentration peak depth Rp and the diffusion variation width ΔRp result in values different from them.

Incidentally, if the respective parts of the ion implantation device malfunction, then the substantial dose (i.e., dose in the target area set so as to be the impurity-implanted layer 72, which is placed between the depths Re1 and Re2) of the impurity 70 is reduced as compared with the case in which no malfunctions occur in the respective parts of the ion implantation device. Such a phenomenon occurs due to the fact that the concentration peak depth Rp is displaced from the set value RP of the implantation depth. Assuming that the dose of the impurity 70 in the target area where no malfunctions occur in the respective parts of the ion implantation device, is 100%, for example, the substantial dose of the impurity 70 is reduced to about 16% with only a displacement of the concentration peak depth Rp from the set value RP of the implantation depth, which displacement is equivalent to of about twice (i.e., about 560 Å) the diffusion variation width ΔRp, where the respective parts of the ion implantation device malfunction.

Next, the ion implantation device heat-treats the whole measuring wafer 10 at a predetermined temperature (e.g., about 950° C.) to activate the impurity 70 of the impurity-implanted layer 72. With the activation of the impurity 70, an impurity active layer 72 is formed from the impurity-implanted layer 72 (see FIG. 10C). This impurity active layer 74 serves as a conductive layer. And the ion implantation device removes the oxide film 14 from the Si wafer 12 to expose the impurity active layer 74. Incidentally, an unillustrated device other than the ion implantation device may be caused to perform the heat treatment and the removal of the oxide film 14.

Thereafter, an unillustrated measurement device is operated to measure surface resistivity of the measuring wafer 10 by a four probe method or the like.

The surface resistivity Rs of the measuring wafer 10 is equivalent to electric resistivity with Ω/sq as the unit and may be referred to as "sheet resistance". Incidentally, the surface resistivity Rs of the measuring wafer 10 can be provided by a pre-executed measurement with the relationship with the concentration peak depth Rp of the impurity 70 as Table. That is, the surface resistivity Rs of the measuring wafer 10 can be provided by taking, as Table, a relationship as to what value reaches the concentration peak depth Rp of the impurity 70 according to to what extent the value of the surface resistivity Rs corresponds.

The surface resistivity Rs of the measuring wafer 10 decreases as the substantial dose of the impurity 70 increases, and increases as the substantial dose thereof decreases. There may be cases in which the substantial dose of the impurity 70 depends on the concentration peak depth Rp of the impurity 70 and diffusion of the impurity 70 by heat treatment. The substantial dose of the impurity 70 dependent on the former is referred to as "substantial dose (or first substantial dose) dependent on the concentration peak depth". Further, the substantial dose of the impurity 70 dependent on the latter is called "substantial dose (or second substantial dose) dependent on the heat treatment".

When the concentration peak depth Rp of the impurity 70 reaches the set value RP of the implantation depth, the surface resistivity Rs of the measuring wafer 10 becomes the minimum. This is because the first substantial dose of the impurity 70 reaches the maximum.

On the other hand, as the concentration peak depth Rp of the impurity 70 falls outside the set value RP of the implantation depth, the surface resistivity Rs of the measuring wafer 10 increases. This is because the impurity 70 is partly implanted in an area (i.e., area deeper than the neighborhood of the surface of the Si wafer 12, or the oxide film 14) out of the neighborhood of the surface of the Si wafer 12, so that the first substantial dose of the impurity 70 decreases. Since the thickness of the Si wafer 12 is thick even though the concentration peak depth Rp of the impurity 70 falls outside the set value RP of the implantation depth, the implanted impurity 70 is injected into an internal area (i.e., area deeper than the neighborhood of the surface of the Si wafer 12) of the Si wafer 12 for the most part. Further, the impurity 70 implanted in the area is partly diffused due to the influence of heat treatment and forms a conductive layer. Therefore, the second substantial dose of the impurity 70 increases. Thus, the substantial dose of the impurity 70 is not so reduced because the amount of an increase in the second substantial dose is added to the amount of a decrease in the first substantial dose. As a result, the surface resistivity Rs of the measuring wafer 10 increases since the concentration peak depth Rp of the impurity 70 falls outside the set value RP of the implantation depth but is relatively small in the amount of its increase.

When the measurement device measures the surface resistivity Rs of the measuring wafer 10, it compares the surface resistivity Rs and an allowable value set in advance and determines whether the concentration peak depth Rp of the impurity 70 falls within an allowable range. Incidentally, the allowable value is equivalent to the value of surface resistivity Rs corresponding to the concentration peak depth Rp where the distance of the concentration peak depth Rp from the set value RP of the implantation depth reaches a limit allowable as a displacement width. This allowable value is suitably set according to operations. When the surface resistivity Rs is of the allowable value or less, the measurement device determines that the concentration peak depth Rp falls within the allowable range. In this case, each semiconductor device maker determines that the concentration peak depth Rp remains unchanged. On the other hand, when the surface resistivity Rs is larger than the allowable value, the measurement device determines that the concentration peak depth Rp falls outside the allowable range. In this case, each semiconductor device maker determines that the concentration peak depth Rp falls outside the set value RP of the implantation depth, and resets the state of the ion implantation device.

Each semiconductor device maker has monitored the implantation depth of the impurity 70 by the above-mentioned method (refer to, for example, a patent document, i.e., Japanese Patent Application Laid-Open No. 2003-151913 (third to fifth paragraphs, eighteenth to fiftieth paragraphs, and FIGS. 1 through 10)).

Meanwhile, the implantation depth of the impurity 70 couldn't be monitored so far satisfactorily due to the following reasons.

(1) The surface resistivity Rs of the measuring wafer 10 varies due to the fact that the implantation depth (concentration peak depth Rp) of the impurity from the main surface of the wafer falls outside the set value RP of the implantation depth. However, a variation in the implantation depth of the impurity 70 couldn't be detected accurately up to now since the amount of an increase in the surface resistivity Rs was relatively small.

(2) The surface resistivity Rs of the measuring wafer 10 varies even due to the fact that the concentration profile of the impurity 70 changes due to the influence of heat treatment. Thus, the surface resistivity Rs of the measuring wafer 10 changes even by being affected by factors irrelevant to the injection energy E quantitatively given to the impurity 70 by the ion implantation device. Therefore, the variation in the implantation depth of the impurity 70 could not be detected accurately up to now.

Since the first substantial dose of the impurity 70 becomes the maximum when the concentration peak depth Rp of the impurity 70 is in the vicinity of the set value RP of the implantation depth as mentioned above, for example, the surface resistivity Rs of the measuring wafer 10 becomes the minimum. On the other hand, as the concentration peak depth Rp of the impurity 70 falls outside the set value RP of the implantation depth, the first substantial dose of the impurity 70 decreases and hence the surface resistivity Rs of the measuring wafer 10 increases. Due to the fact that the concentration peak depth Rp of the impurity 70 falls outside the set value RP of the implantation depth in this way, the first substantial dose of the impurity 70 changes and correspondingly the surface resistivity Rs of the measuring wafer 10 changes.

When the concentration profile of the impurity 70 changes due to the influence of heat treatment as described above, the second substantial dose of the impurity 70 increases and hence the surface resistivity Rs of the measuring wafer 10 decreases. Due to the fact that the concentration profile of the impurity 70 changes due to the influence of heat treatment in this way, the second substantial dose of the impurity 70 changes and correspondingly the surface resistivity Rs of the measuring wafer 10 changes.

If the surface resistivity Rs of the measuring wafer 10 changes, it is then unclear to what extent which of the change in the first substantial dose of the impurity 70 and the change in the second substantial dose of the impurity 70 influences the amount of its change. That is, it is not clear to what extent the amount of change in the surface resistivity Rs increases due to the fact that the concentration peak depth Rp of the impurity 70 falls outside the set value RP of the implantation depth or to what extent the amount thereof decreases due to the fact that the concentration profile of the impurity 70 changes. Therefore, the variation in the implantation depth of the impurity 70 could not be detected so far.

(3) Particularly when the injection energy E is relatively small, the surface resistivity Rs of the measuring wafer 10 is affected by factors irrelevant to the injection energy E quantitatively given to the impurity 70 by the ion implantation device and is liable to variation. Therefore, when the injection energy E is relatively small in particular, the variation in the implantation depth of the impurity 70 could not be detected accurately by only the quantitative factors such as the injection energy E.

When, for example, many defects occur in the surface of a target to be implanted, the concentration peak depth Rp of the impurity 70 is apt to fall outside the set value RP of the implantation depth according to the number of the defects. Therefore, the first substantial dose of the impurity 70 is also liable to change according to the number of the defects in the surface of the target to be implanted. Further, the surface resistivity Rs of the measuring wafer 10 is also apt to change according to the change in the first substantial dose of the impurity 70. Thus, the surface resistivity Rs of the measuring wafer 10 is liable to change according to the number of defects in the surface of the target to be implanted, that is, with being affected by the factors irrelevant to the injection energy E quantitatively given to the impurity 70 by the ion implantation device. Since the concentration peak depth Rp of the impurity 70 is greatly affected by the number of the defects in the surface of the target to be implanted where the injection energy E is relatively small in particular, such a phenomenon noticeably appears. Therefore, a variation in the implantation depth of the impurity 70 could not be detected accurately so far with only the quantitative factors such as the injection energy E particularly when the injection energy E was relatively small.

Incidentally, the variation in the implantation depth of the impurity 70 can be monitored even by measuring the number of defects in the surface of the measuring wafer 10. However, the present method was not capable of accurately detecting the variation in the implantation depth of the impurity 70 either due to the above reasons (1) through (3) in a manner similar to the monitoring of the surface resistivity Rs of the measuring wafer 10 by measurement. Since the influence suffered from the number of the defects in the surface of the measuring wafer 10 differed according to the type of impurity 70 in particular, the present method could not detect the variation in the implantation depth of the impurity 70 accurately with only the quantitative factors such as the injection energy E.

As described above, the surface resistivity Rs of the measuring wafer 10 is relatively small in the amount of its increase even though the concentration peak depth Rp of the impurity 70 falls outside the set value RP of the implantation depth. Further, the surface resistivity Rs thereof changes even by being affected by the factors irrelevant to the injection energy R quantitatively given to the impurity 70 by the ion implantation device. Therefore, the implantation depth of the impurity 70 could not be monitored satisfactorily so far. Particularly when the injection energy E is relatively small, the variation in the implantation depth of the impurity 70 could not be detected accurately with only the quantitative factors such as the injection energy E.

SUMMARY OF THE INVENTION

With the foregoing in view, it is an object of the present invention to provide a method for satisfactorily monitoring an implantation depth of an impurity.

According to one aspect of the present invention, for achieving the above object, there is provided a method for measuring an implantation depth of an impurity implanted in a wafer by an ion implantation device, using a measurement device and monitoring whether the measured implantation depth falls within an allowable range. In the present method, a wafer in which an Si layer having a thickness of a 1000 Å unit (i.e., $n \times 10^3$ Å) or less (more preferably $2 \times 10^3$ Å or less) is formed on an insulating film, is used as a measuring wafer. The measuring wafer is subjected to heat treatment after the impurity has been implanted therein from above a main surface of the Si layer. At this time, the impurity implanted in the Si layer is diffused due to the influence of heat treatment. As a result, the measuring wafer has a conductive layer formed in the Si layer. In the present invention, a concentration peak depth is detected as the impurity implantation depth by measuring surface resistivity of a main surface of the heat-treated measuring wafer.

The measuring wafer employed in the present invention is significantly thinner that the conventional wafer in the thickness of the Si layer with the conductive layer formed therein. Therefore, in the present invention, a first substantial dose of the impurity is markedly reduced as compared with the conventional method when a concentration peak depth Rp of the impurity falls outside a set value RP of the implantation depth. Correspondingly, the surface resistivity of the measuring wafer greatly increases as compared with the conventional method. Further, in the present invention, the amount of an increase in the surface resistivity of the measuring wafer due to the decrease in the first substantial dose of the impurity becomes drastically larger than the amount of a decrease in the surface resistivity of the measuring wafer due to an increase in second substantial dose of the impurity. Therefore, the majority of the amount of change in the surface resistivity of the measuring wafer can be regarded as the increased amount due to the decrease in the first substantial dose of the impurity in the present invention. As a result, the present invention is capable of accurately detecting a variation in the implantation depth of the impurity as compared with the conventional method.

Incidentally, when the set value of the implantation depth of the impurity is defined as RP and a diffusion variation width as viewed in the direction of the implantation depth of the impurity is defined as ΔRp, such a wafer that the thickness of the Si layer is set as 2×ΔRp, may preferably be used as a measuring wafer upon implementation of the present invention. However, the value of "twice" has an allowable range of about 10% in the vicinity thereof. Accordingly, the thickness of the Si layer formed with the conductive layer of the measuring wafer may preferably be about 2×ΔRp×(1±0.1) (i.e., about 1.8×ΔRp to 2.2×ΔRp). When the concentration peak depth Rp coincides with the set value RP of the implantation depth, such a measuring wafer reaches the maximum in the dose of the impurity at the set value RP of the implantation depth. In such a measuring wafer, however, the dose of the impurity at the set value RP of the implantation depth is reduced to about 16% with only a displacement of the concentration peak depth Rp from the set value RP of the implantation depth, which displacement is equivalent to about twice the diffusion variation width ΔRp. Therefore, such a measuring wafer is particularly preferred because a variation in the implantation depth of the impurity can be detected more accurately. Incidentally, the diffusion variation width corresponds to a distance at which the concentration of the impurity reaches about 50% of the impurity concentration at the set value of the implantation depth as viewed from the set value of the implantation depth of the impurity. According to the result of measurement, when the concentration peak depth Rp coincides with the set value RP of the implantation depth, about ⅔ (68%) of the implanted impurity is normally contained in an area of (RP−ΔRp)~(RP+ΔRp).

Upon implementation of the present invention as well, a wafer in which an oxide film is formed on an Si layer, may preferably be used as a measuring wafer. Such a measuring wafer is particularly preferred because it is capable of effectively preventing outward diffusion of an impurity such as Boron or the like in particular.

When the set value of the implantation depth of the impurity is defined as RP, a wafer in which the thickness of an oxide film is set as (RP−ΔRp) may preferably be used as a measuring wafer upon implementation of the present invention. However, the value of "(RP−ΔRp)" has an allowable range of about 10% in the vicinity thereof. Thus, the thickness of the oxide film may preferably be about (RP−ΔRp)×(1±0.1) (i.e., about 0.9×(RP−ΔRp)~1.1×(RP−ΔRp). Such a measuring wafer is particularly preferred because when an impurity is implanted at large injection energy, a margin can be made large.

Upon implementation of the present invention, the measurement of surface resistivity of a measuring wafer may preferably be performed as intended for a measuring wafer in which a TEG pattern (Test Element Group pattern) is formed on its corresponding insulating film by use of an Si layer after heat treatment. Such a measuring wafer is particularly preferred because an impurity concentration profile subsequent to respective process steps such as impurity implantation, thermal treatment, oxide film removal, etc. can be analyzed with high precision.

Upon implementation of the present invention, an SOI wafer in which an Si layer is formed on an $SiO_2$ layer used as an insulating film, may preferably be used as a measuring wafer. Upon implementation of the present invention as well, a wafer in which an Si layer is formed over both an SiO$_2$ layer used as an insulating film and a hollow area, may preferably be used as a measuring wafer. Further, an SOS wafer in which an Si layer is formed on an Al$_2$O$_3$ layer used as an insulating film, may preferably be used as a measuring wafer upon implementation of the present invention. Still further, an SOQ wafer in which an Si layer is formed on a quartz layer used as an insulating film, may preferably be used as a measuring wafer upon implementation of the present invention. In the case of such measuring wafers, manufacturing wafers introduced onto a production line can be immediately used as the measuring wafers. Therefore, there is no need to stop the production line as in the prior art. It is therefore possible to improve the efficiency of manufacture.

In the present invention, the amount of change in surface resistivity Rs of the measuring wafer due to the fact that the concentration peak depth Rp of the impurity from the main surface of the wafer falls outside the set value RP of the implantation depth from the main surface of the wafer can be greatly increased as compared with the conventional method. Further, in the present invention, the majority of the amount of change in surface resistivity Rs of the measuring wafer can be regarded as an amount increased due to the fact that the concentration peak depth Rp of the impurity falls outside the set value RP of the implantation depth.

Thus, the present invention is capable of accurately detecting a variation in the concentration peak depth Rp of the impurity as compared with the conventional method. Consequently, the variation in the concentration peak depth Rp of the impurity can be monitored satisfactorily.

Even when the injection energy E is relatively small in particular, the present invention is capable of satisfactorily monitoring a variation in impurity concentration peak depth Rp.

Incidentally, the wafer prepared for exclusive use has been utilized as the measuring wafer upon measurement of the implantation depth Rp of the impurity in the prior art. Therefore, there was conventionally a need to stop the production line in order to introduce the measuring wafer onto the production line for the ion implantation device. Thus, the efficiency of manufacture of the semiconductor device has heretofore been reduced. On the other hand, the present invention uses, as the measuring wafers, wafers such as the SOI wafer, SOS wafer, SOQ wafer, etc., in each of which the thickness of the Si layer formed with the conductive layer is significantly thinner than the conventional measuring wafer. Such wafers have been used as the manufacturing wafers on a routine basis. Therefore, the present invention needs not to stop the production line in order to introduce the measuring wafer onto the production line of the ion implantation device. Accordingly, the present invention is capable of enhancing the efficiency of manufacture of the semiconductor device as compared with the prior art.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
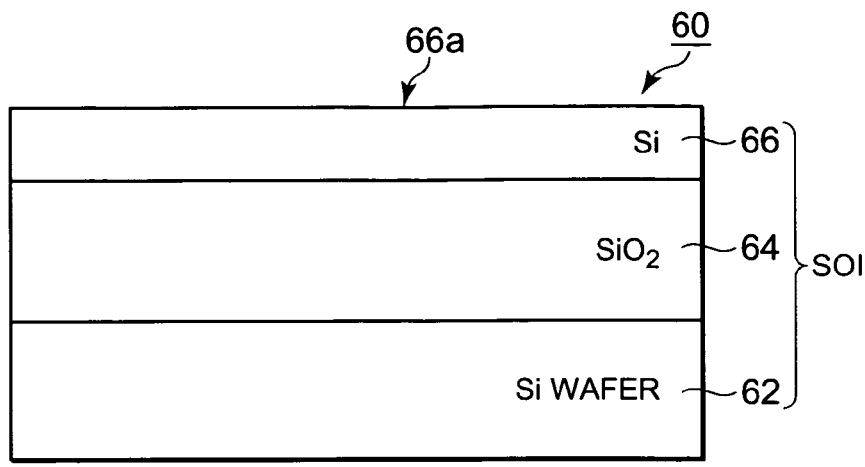
FIGS. 1A through 1D are views showing configurations of measuring wafers employed in the present invention.

Preferred embodiments of the present invention will hereinafter be described with reference to the accompanying drawings. Incidentally, the respective figures merely roughly show the shape, size and positional relationships of the respective components to such a degree that the present invention can be understood. Thus, the present invention is by no means limited to the illustrated examples alone. Common elements and like elements in the respective figures are given the same reference numerals. Dual explanations thereof are omitted.

<As to Configuration of Measuring Wafer>

A configuration of a measuring wafer employed in the present invention will be explained below using FIG. 1. Incidentally, FIG. 1 is a view showing the configuration of the measuring wafer employed in the present invention.

FIG. 1A shows a measuring wafer 60 comprising an SOI (Silicon on Insulation) wafer in which an SiO$_2$ layer 64 used as an insulating film is formed on an Si wafer 62 and an Si layer 66 is further formed on the SiO$_2$ layer 64. Incidentally, the Si layer 66 is a layer formed with a conductive layer.

Figure 1B:
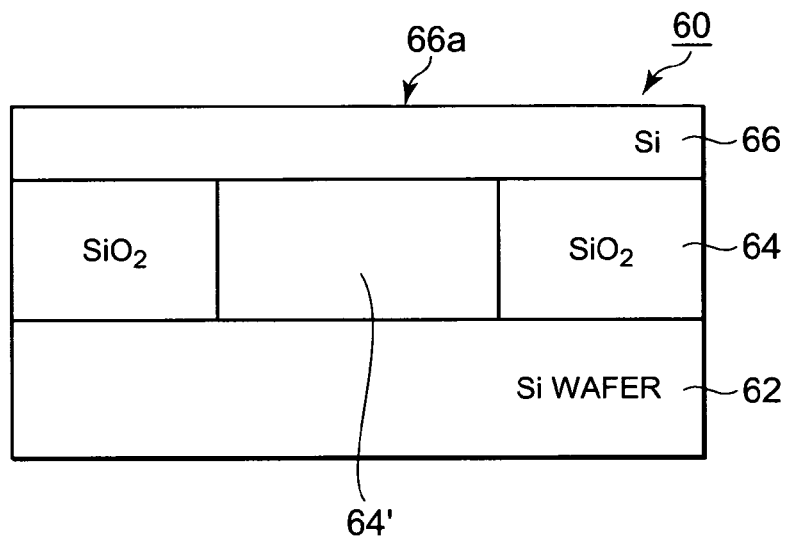

FIG. 1B shows a measuring wafer 60 in which an SiO$_2$ layer 64 and a hollow area 64' each used as an insulating film are formed on an Si wafer 62 and an Si layer 66 is further formed on these. The hollow area 64' is an area formed by a through hole defined in the SiO$_2$ layer 64 in advance. Incidentally, the Si layer 66 is a layer formed with a conductive layer.

Figure 1C:
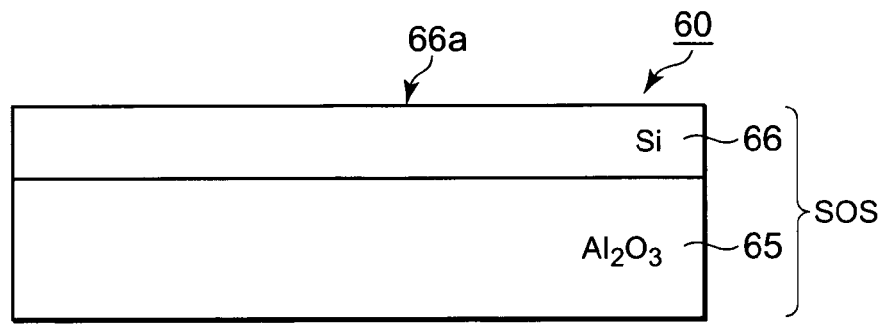

FIG. 1C shows a measuring wafer 60 comprising an SOI (Silicon on Sapphire) wafer in which an Si layer 66 is formed on an Al$_2$O$_3$ layer (sapphire substrate) 65. Incidentally, the Al$_2$O$_3$ layer 65 is of an insulating film, and the Si layer 66 is a layer formed with a conductive layer.

Figure 1D:
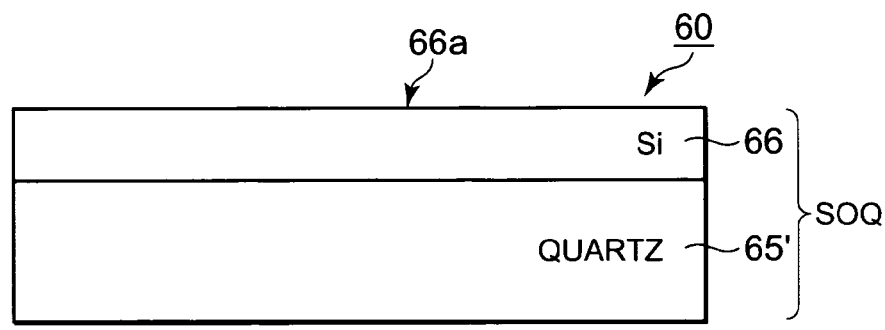

FIG. 1D shows a measuring wafer 60 comprising an SOQ (Silicon on Quarts) in which an Si layer 66 is formed on a quartz layer 65'. Incidentally, the quartz layer 65' is of an insulating film, and the Si layer 66 is a layer formed with a conductive layer.

Ion species (hereinafter called simply "impurity") 70 of an impurity such as Phosphorus (P), Arsenic (As), Boron or the like are injected into such measuring wafers 60 from above upper surfaces 66a of the Si layers 66.

<Configuration of System>

A configuration of a system (hereinafter called "monitor system") employed in the present invention will be explained below.

Figure 2:
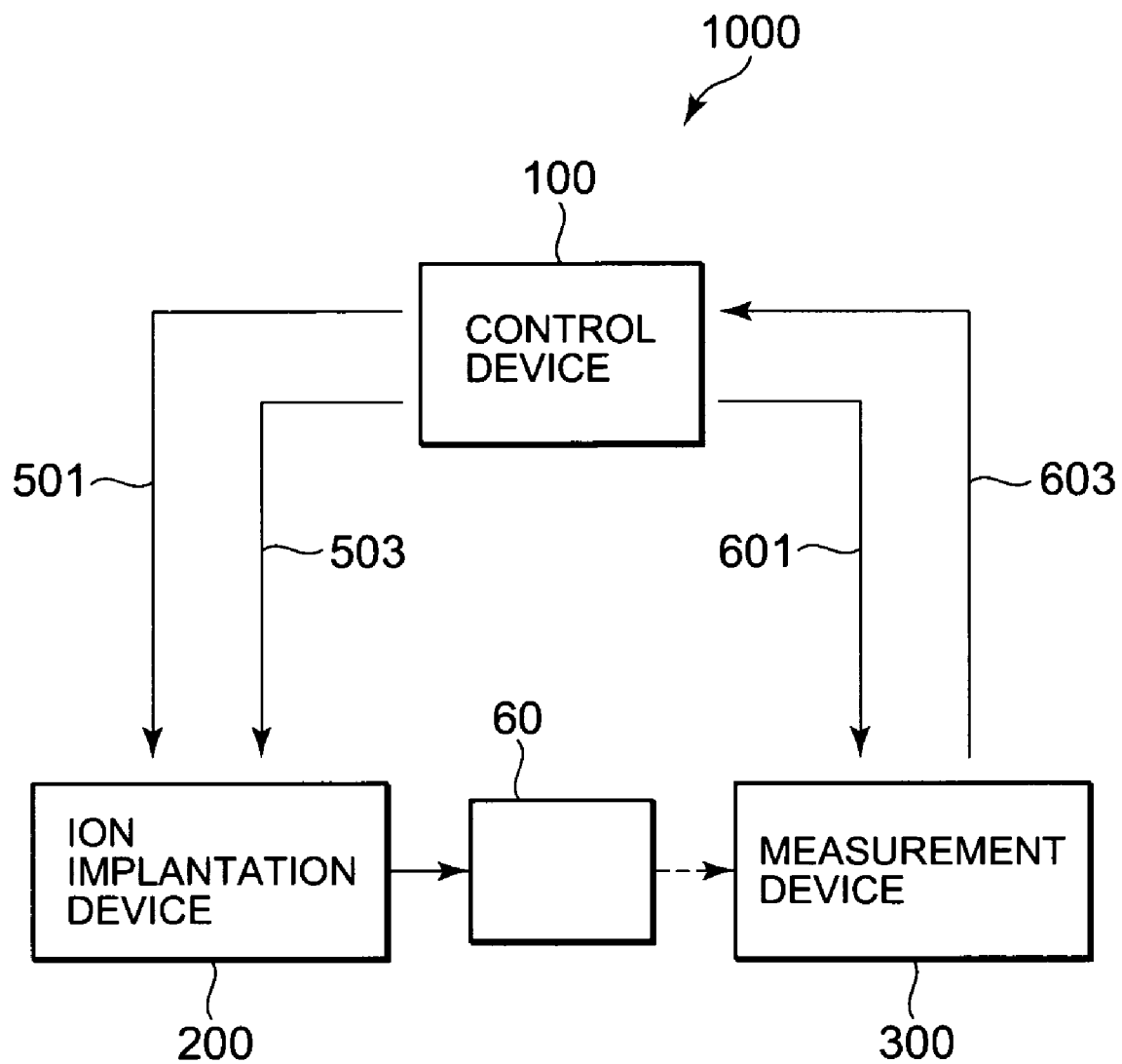
FIG. 2 is a view illustrating a configuration of a monitor system.

The monitor system employed in the present invention is shown in FIG. 2. As shown in FIG. 2, the monitor system 1000 has a control device 100 that controls respective devices, an ion implantation device 200 that injects an impurity 70 into a measuring wafer 60 (or unillustrated manufacturing wafer), a measurement device 300 that measures surface resistivity Rs of the measuring wafer 60 and outputs the result of measurement to the control device 100, and a transfer device (not shown) that transfers the measuring wafer 60 from the ion implantation device 200 to the measurement device 300.

Incidentally, the control device 100 is constituted of a personal computer (hereinafter called "PC") in the present embodiment. The control device 100 generates a signal for causing the ion implantation device 200 to inject the impurity 70 into the measuring wafer 60 with predetermined timing and outputs the signal to the ion implantation device 200 as a control signal 501. Also the control device 100 generates a signal for causing the measurement device 300 to measure a concentration peak depth Rp of the impurity 70 and outputs the signal to the measurement device 300 as a control signal 601. Incidentally, the predetermined timing corresponds to, for example, a case in which the ion implantation device 200 is operated for a predetermined period, a case in which a predetermined number of semiconductor devices are manufactured, etc. When the concentration peak depth Rp of the impurity 70 reaches a depth different from a set value, the control device 100 generates a signal for causing the ion implantation device 200 to correct an injection or implantation depth of the impurity 70 and outputs the signal to the ion implantation device 200 as a control signal 503.

In the present embodiment, the ion implantation device 200 is configured so as to perform heat or thermal treatment of the measuring wafer 60 and removal of a second oxide film 68 to be described later. However, the thermal treatment of the measuring wafer 60 and the removal of the second oxide film 68 to be described later may be carried out by an unillustrated device other than the ion implantation device.

<As to Processing Process>

Figure 3:
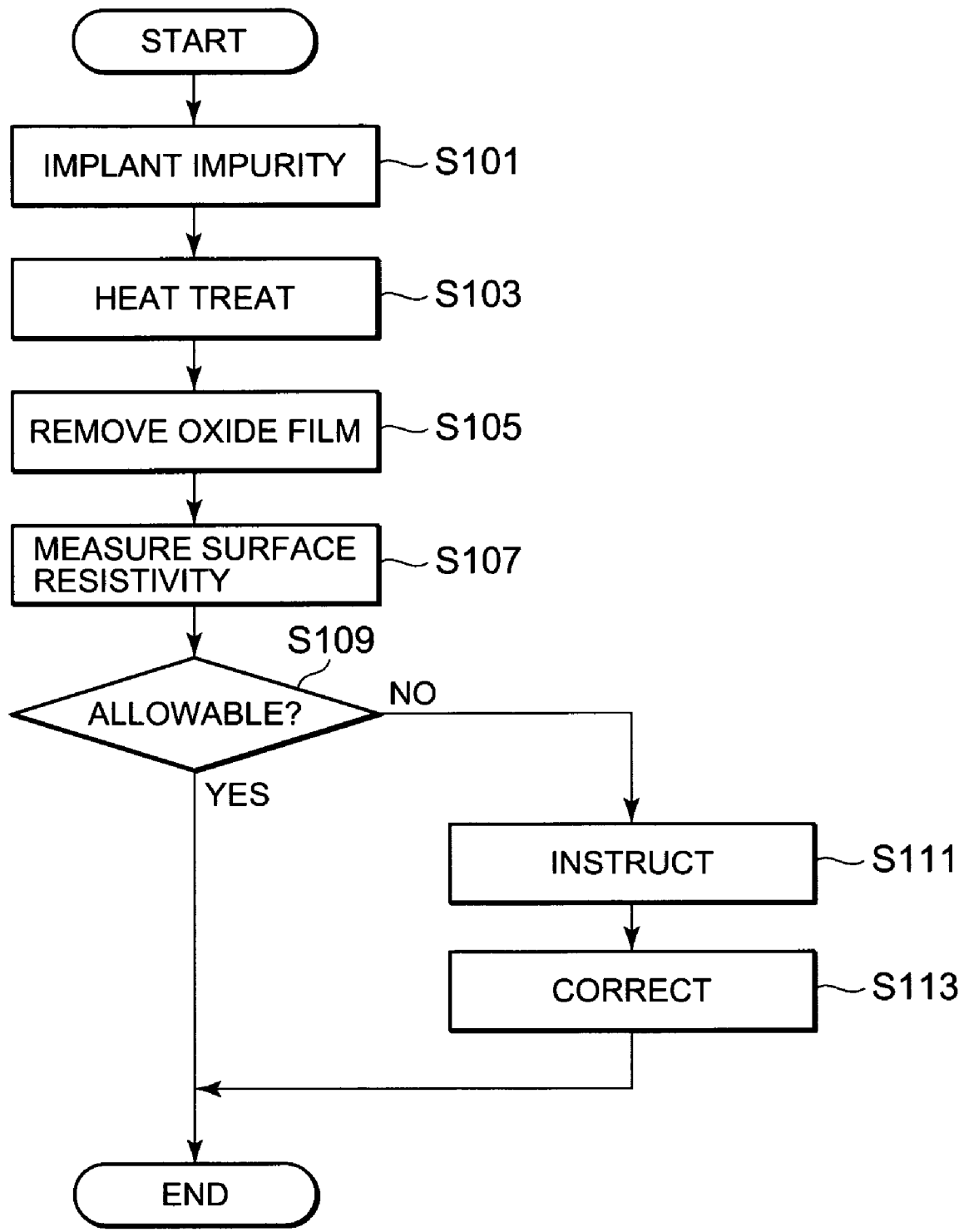
FIG. 3 is a flowchart depicting a processing process according to the present invention.

A processing process according to the present invention will be described below using FIGS. 3 through 5. Incidentally, FIG. 3 is a flowchart showing the processing process according to the present invention. FIG. 4 is a view for describing the processing process effected on a measuring wafer, and FIG. 5 is a partly enlarged view of the measuring wafer. Incidentally, the SOI wafer shown in FIG. 1A will be used as the measuring wafer 60 here.

Incidentally, an example illustrative of a configuration of the measuring wafer 60 shown in FIGS. 4 and 5 is shown in which an $SiO_2$ 68 is provided on an Si layer 66. There may be cases in which an $SiO_2$ 64 provided below the Si layer 66 is hereinafter referred to as a first oxide film and the $SiO_2$ 68 provided on the Si layer 66 is hereinafter referred to as a second oxide film. Also the Si layer 66 might be defined as an SOI (Silicon on Insulator) layer. A main surface of the measuring wafer 60 serves as an exposed upper surface 68a of the second oxide film 68. An impurity 70 is implanted from above the upper surface 68a of the second oxide film 68. However, the measuring wafer 60 might not be provided with the $SiO_2$ 68. In this case, the main surface of the measuring wafer 60 serves as an exposed upper surface 66a of the Si layer 66, and the impurity 70 is injected from above the upper surface 66a of the Si layer.

Let's assume that the center as viewed in the direction of thickness of the SOI layer 66 is defined as C, the thickness of the Si layer (SOI layer) 66 is defined as H, and the thickness of the second oxide film 68 is defined as h. Also assume that a set value of the depth of implantation of the impurity 70 from the main surface of the measuring wafer 60, i.e., the upper surface 68a of the second oxide film 68 is defined as RP and a concentration peak depth of the impurity 70 from the same main surface is defined as Rp. Let's further assume that the width of a variation in the diffusion of the impurity 70 from the depth RP is defined as ΔRp. In the example shown in FIGS. 4 and 5, the center C in the thickness direction of the SOI layer 66 exists in a position where the distance from the upper surface 66a of the SOI layer 66 reaches (H/2) and the distance from the upper surface 68a of the second oxide film 68 reaches (h+H/2). The set value RP of the implantation depth is set to (h+H/2). The concentration peak depth Rp of the impurity 70 reaches a position coincident with the set value RP of the implantation depth if no malfunctions occur in respective parts (e.g., an acceleration part, etc.) of the ion implantation device 200.

Figure 4A:
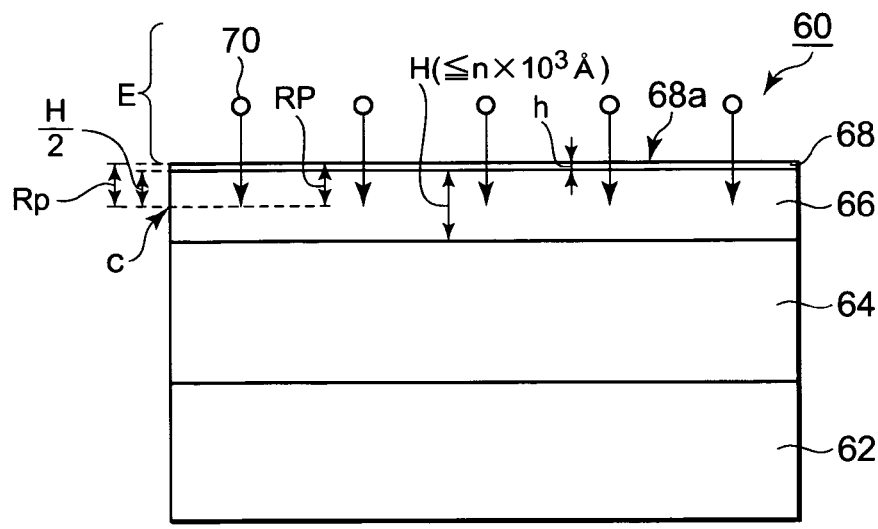
FIGS. 4A through 4C are views for describing a processing process effected on a measuring wafer.
Figure 5:
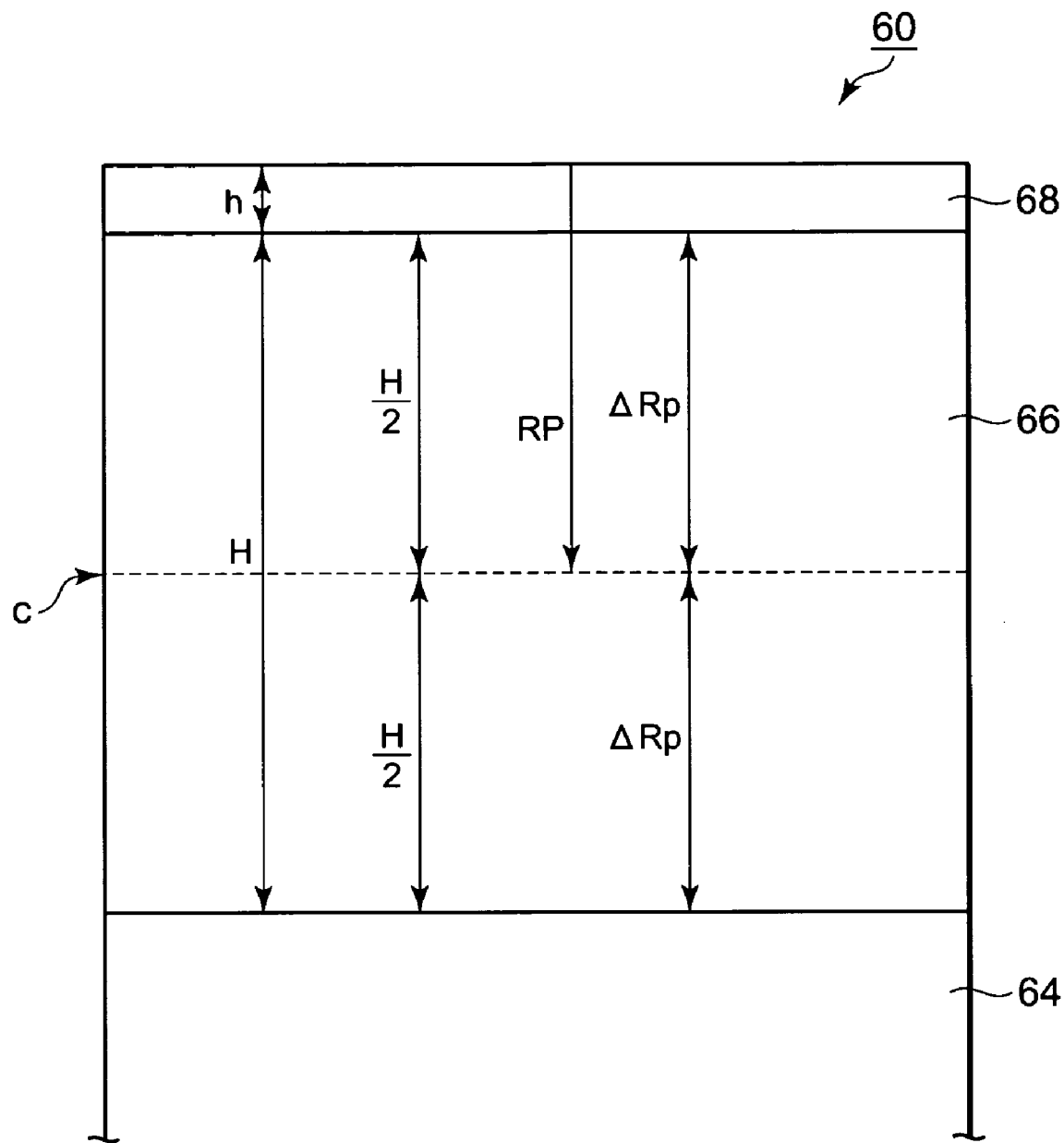
FIG. 5 is a partly enlarged view of the measuring wafer.

Considering that the concentration peak depth Rp of the impurity 70 ranges from about a few hundreds of Å to about thousand and few hundreds of Å, the thickness H of the SOI layer 66 of the measuring wafer 60 may preferably be a 1000 Å unit (n–$10^3$ Å) or less (where "n": arbitrary integer)(see FIG. 4A). Particularly when it is considered that the concentration peak depth Rp of the impurity 70 ranges from about a few hundreds of Å to about thousand and several hundreds of Å, and the width ΔRp of the variation in the diffusion of the impurity 70 as viewed its depth direction is about 100 Å unit (n×$10^2$ Å), the thickness H thereof may preferably be 2×$10^3$ Å or less. The thickness H of the SOI layer 66 of the measuring wafer 60 may preferably be about twice the width ΔRp of the variation in the diffusion of the impurity 70 as viewed in its depth direction (i.e., 2×ΔRp). However, the value of "this twice" has an allowable range of about 10% in the vicinity thereof. Thus, the thickness H of the SOI layer 66 of the measuring wafer 60 may preferably be about 2×ΔRp×(1±0.1) (i.e., about 1.8×ΔRp~2.2×ΔRp).

In Step (hereinafter described as "S") 101 as shown in FIG. 3, the ion implantation device 200 accelerates the impurity 70 at injection energy E set such that the impurity 70 is implanted to the set value RP of the implantation depth, based on the control signal 501 outputted from the control device 100 and injects the impurity 70 into the measuring wafer 60 from above the upper surface 68a of the second oxide film 68 (see FIG. 4A).

Incidentally, the SOI wafer described in FIG. 1A as the measuring wafer 60 is used and phosphorous (P) is used as the impurity 70 in the example illustrated in FIG. 4. In the example described here, the second oxide film ($SiO_2$) 68 is formed on the SOI layer 66 in the measuring wafer 60. The second oxide film 68 serves as a film for prevention of outward diffusion of the impurity 70. Incidentally, the second oxide film 68 may be formed where an impurity 70 large in outward diffusion, such as Boron or the like is implanted. However, when an impurity 70 small in outward diffusion, such as Phosphorus (P), Arsenic (As) or the like is implanted, it is not necessary to form the second oxide film 68. The injection energy E is set in consideration of the thickness of the second oxide film 68 formed on the SOI layer 66 in such a manner that the concentration peak depth Rp of the impurity 70 coincides with the center C of the SOI layer 66 as viewed in its thickness direction.

Figure 4B:
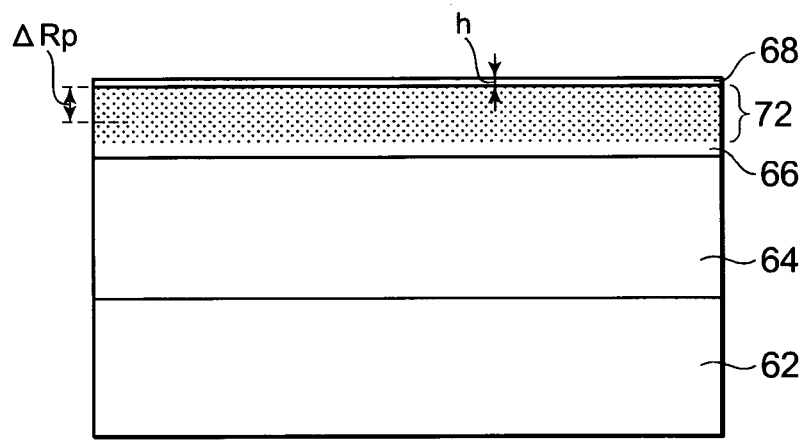
Figure 4C:
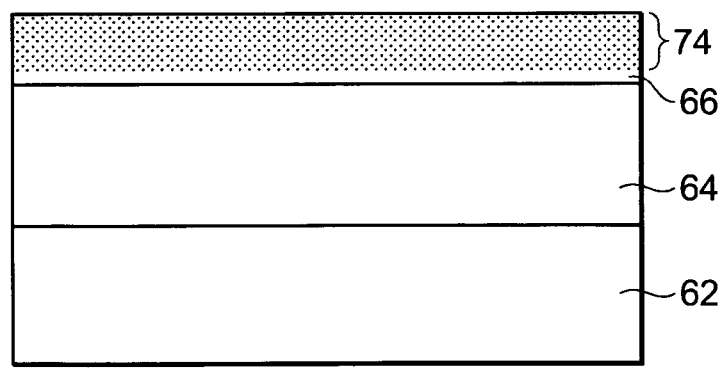
Figure 11:
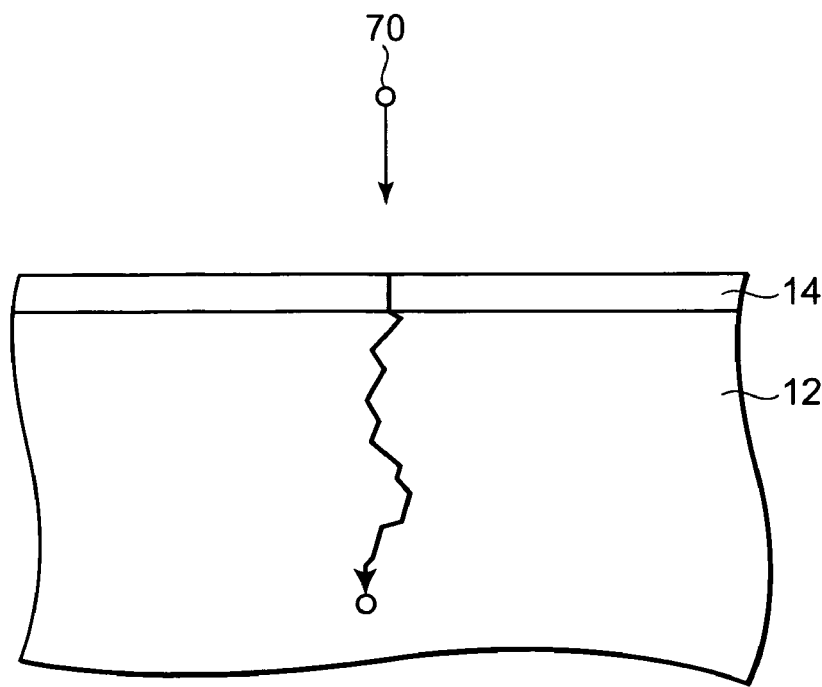
FIG. 11 is a view showing the process of intrusion of an impurity.

While outward diffusion of the impurity 70 is being suppressed by the second oxide film 68, the impurity 70 implanted in the measuring wafer 60 passes through the second oxide film 68 and reaches the SOI layer 66. And the impurity 70 collides with an internal crystal of the measuring wafer 60 and proceeds to the SOI layer 66 while being scattered, and stops at a point where the injection energy E is used up (see FIG. 11). Thus, the ion implantation device 200 forms an impurity-implanted layer 72 in which the impurity 70 is implanted, in the SOI layer 66 as shown in FIG. 4B.

Next, in S103, the ion implantation device 200 effects heat treatment on the measuring wafer 60 and activates the impurity 70 of the impurity-implanted layer 72. With the activation of the impurity 70, an impurity active layer 74 is formed from the impurity-implanted layer 72 (see FIG. 4C). The present impurity active layer 74 is of a conductive layer.

Next, in S105, the ion implantation device 200 removes the second oxide film 68 from the measuring wafer 60 to expose the impurity active layer 74.

Next, in S107, the measurement device 300 measures surface resistivity Rs of the measuring wafer 60, based on a control signal outputted from the control device 100 and outputs the result of measurement to the control device 100. Incidentally, if the concentration peak depth Rp of the impurity 70 is in the vicinity of the set value RP of the implantation depth, then the surface resistivity Rs of the measuring wafer 60 reaches a minimum. This is because the substantial dose of the impurity 70 reaches a maximum. When the concentration peak depth Rp of the impurity 70 goes out of the set value RP of the implantation depth, the surface resistivity Rs of the measuring wafer 60 greatly increases. This is because most of the implanted impurities 70 are implanted in an area (i.e., first oxide film 64 or second oxide film 68) out of the conductive layer, so that the substantial dose of the impurity 70 decreases markedly.

Next, in S109, the control device 100 compares the surface resistivity Rs of the measuring wafer 60 measured by the measurement device 300 and an allowable value set in advance and determines whether the concentration peak depth Rp of the impurity 70 is within an allowable range. Incidentally, the allowable value is equivalent to the value of surface resistivity Rs corresponding to the concentration peak depth Rp where the distance of the concentration peak depth Rp from the set value RP of the implantation depth becomes a limit allowable as a displacement width. This allowable value is suitably set according to operations. When the surface resistivity Rs is the allowable value or less, the control device 100 determines that the concentration peak depth Rp falls within the allowable range. And the control device 100 determines that the concentration peak depth Rp remains unchanged and terminates the process. On the other hand, when the surface resistivity Rs is larger than the allowable value, the control device 100 determines that the concentration peak depth Rp falls outside the allowable range. And the control device 100 determines that the concentration peak depth Rp of the impurity 70 is varying and advances the process to S111.

In S111, the control device 100 generates a control signal 503 for calculating the amount of correction of the injection energy E of the ion implantation device 200 and correcting the injection energy E and outputs it to the ion implantation device 200. Incidentally, the calculation of the amount of correction of the injection energy E will be explained below.

In S113, the ion implantation device 200 corrects the injection energy E on the basis of the control signal 503 outputted from the control device 100.

The operation of the system is thus finished.

<As to Surface Resistivity Rs>

The conventional measuring wafer 10 is very thicker than the measuring wafer 60 employed in the present invention in terms of the thickness of the Si wafer 12 formed as the conductive layer. Therefore, most of the implanted impurities 70 are implanted in the area (i.e., area deeper than the area used as the conductive layer of the Si wafer 12) lying inside the Si wafer 12 even though the concentration peak depth Rp of the impurity 70 falls outside the set value RP of the implantation depth. Further, some of the impurities 70 implanted in the area are diffused into the conductive layer due to the influence of thermal treatment. As a result, the substantial dose of the impurity 70 is not so reduced. Accordingly, the surface resistivity Rs of the measuring wafer 10 increases because the concentration peak depth Rp of the impurity 70 falls outside the set value RP of the implantation depth. However, the amount of its increase is relatively small.

In the measuring wafer 60 employed in the present invention in contrast to above, the thickness of the SOI layer 66 formed as the conductive layer is very thinner than the thickness of the Si wafer 12 of the conventional measuring wafer 10 as mentioned above. Therefore, when the concentration peak depth Rp of the impurity 70 falls outside the set value RP of the implantation depth, most of the implanted impurities 70 are injected into an area (i.e., first oxide film 64 or second oxide film 68) lying outside the SOI layer 66. As a result, the area S shown in FIG. 12 containing about ⅔ (about 68%) of the implanted impurities 70 is formed in the area lying outside the SOI layer 66. Thus, the substantial dose of the impurity 70 (i.e., the dose of the impurity 70 injected into the SOI layer 66 used as the conductive layer) decreases significantly. Accordingly, the surface resistivity Rs of the measuring wafer 60 greatly increases when the concentration peak depth Rp of the impurity 70 falls outside the set value RP of the implantation depth.

Thus, in the present invention, when the concentration peak depth Rp of the impurity 70 is out of the set value RP of the implantation depth, its influence noticeably appears as a marked increase in the surface resistivity Rs of the measuring wafer 60. Incidentally, some of the impurities 70 injected into the area (i.e., first oxide film 64 or second oxide film 68) lying outside the SOI layer 66 are diffused into the SOI layer 66 formed as the conductive layer due to the influence of heat treatment. Therefore, the surface resistivity Rs of the measuring wafer 60 decreases due to the influence of the heat treatment. However, the amount of a reduction in the surface resistivity Rs of the measuring wafer 60 due to the influence of heat treatment is substantially smaller than the amount of an increase in the surface resistivity Rs due to the fact that the concentration peak depth Rp of the impurity 70 falls outside the set value RP of the implantation depth, and is almost negligible. Therefore, in the present invention, the majority of the amount of change in the surface resistivity RS of the measuring wafer 60 can be regarded as the amount of the increase due to the fact that the concentration peak depth Rp of the impurity falls outside the set value RP of the implantation depth.

Thus, the present invention is capable of significantly increasing the amount of change in the surface resistivity Rs of the measuring wafer 60 due to the fact that the concentration peak depth Rp of the impurity 70 falls outside the set value RP of the implantation depth, as compared with the conventional method. Further, the present invention is capable of assuming the majority of the amount of change in the surface resistivity Rs of the measuring wafer 60 as the amount of the increase due to the concentration peak depth Rp of the impurity 70 being out of the set value RP of the implantation depth.

Accordingly, the present invention can accurately detect the concentration peak depth Rp of the impurity 70 as compared with the conventional method. It is thus possible to satisfactorily monitor a variation in the concentration peak depth Rp of the impurity 70.

<Calculation of the Amount of Correction of Injection Energy E>

Figure 6:
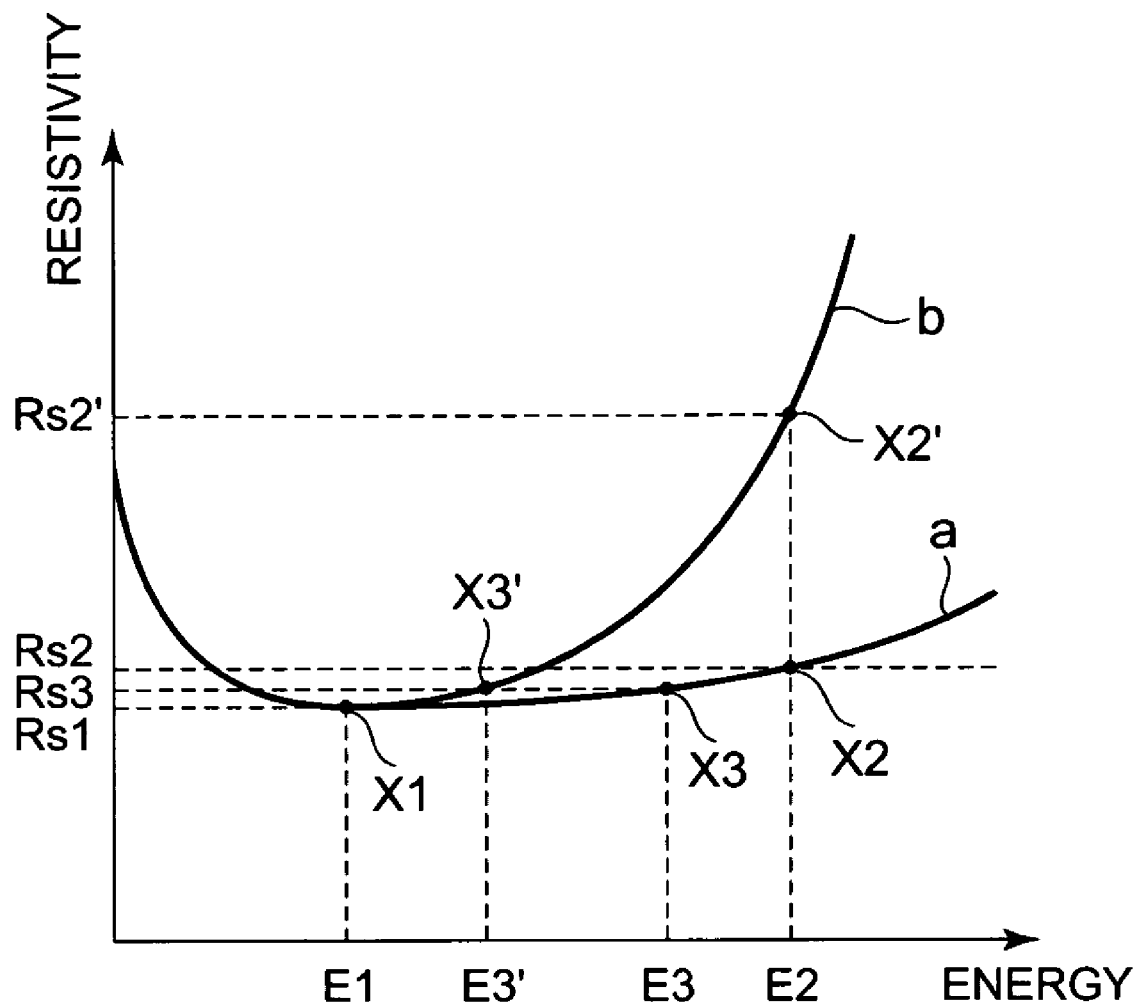
FIG. 6 is a graph view showing the relationship between injection energy and surface resistivity.
Figure 10A:
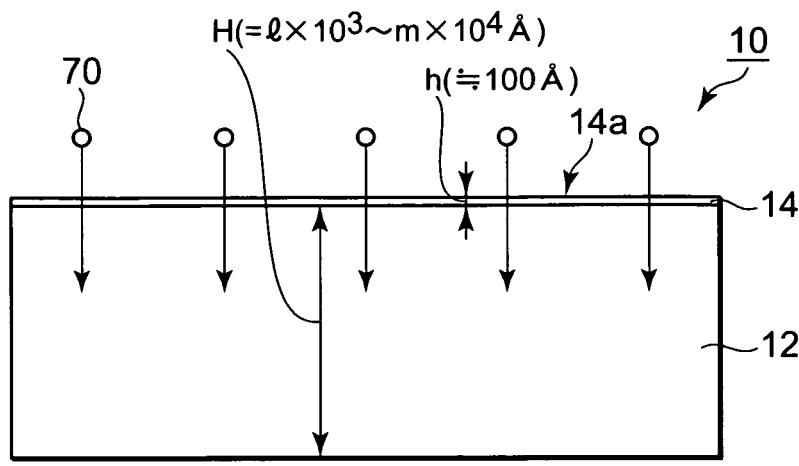
FIGS. 10A through 10C are views for describing a processing process effected on a conventional measuring wafer.
Figure 10B:
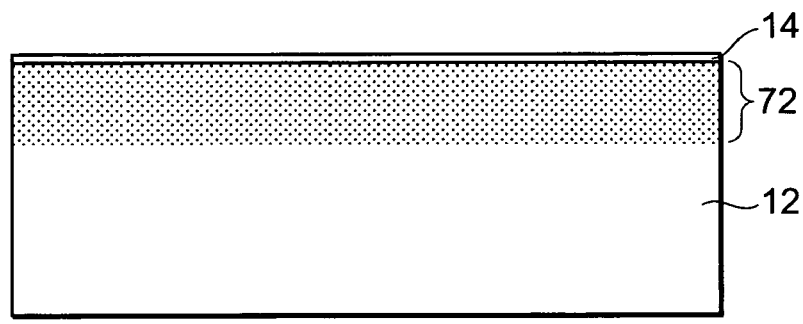
Figure 10C:
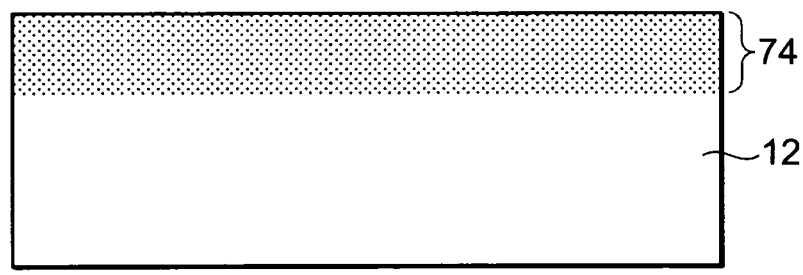

The amount of correction of the injection energy E will be explained below using FIG. 6. Incidentally, FIG. 6 is a graph view showing the relationship between injection energy and surface resistivity. The conventionally used measuring wafer 10 will now be described assuming that it takes such a configuration as shown in FIG. 10. Also the measuring wafer 60 used in the present invention will be explained assuming that it takes such a configuration as shown in FIGS. 4 and 5. Further, the injection energy E will be explained assuming that it is set in such a manner that the set value RP of the implantation depth of the impurity 70 and the center of the SOI layer 66 as viewed in its thickness direction coincide with each other.

In FIG. 6, the horizontal axis indicates the injection energy E, and the vertical axis indicates the surface resistivity Rs. A solid line a indicates the relationship between the injection energy E for the conventionally used measuring wafer 10 and the surface resistivity Rs of the area (i.e., the neighborhood of the surface of the Si layer 12) used as the conductive layer. A solid line b indicates the relationship between the injection energy E for the measuring wafer 60 employed in the present invention and the surface resistivity Rs of the area (i.e., SOI layer 66) used as the conductive layer.

In FIG. 6, a set value of injection energy set to the ion implantation device 200 is assumed to be E1, and actual injection energy is assumed to be E2.

If no malfunctions occur in the respective parts, then the ion implantation device 200 injects an impurity 70 into the measuring wafer 10 or 60 at the set value E1 of the injection energy. A point X1 is a point on the solid line a corresponding to the injection energy E1 at the time that the measuring wafer is of the conventionally used measuring wafer 10, and a point on the solid line b corresponding to the injection energy E1 at the time that the measuring wafer is of the measuring wafer 60 employed in the present invention. A surface resistivity Rs1 is of surface resistivity corresponding to the point X1. The surface resistivity Rs1 becomes a minimum value of the surface resistivity Rs in the present embodiment. Thus, when the impurity 70 is implanted in the measuring wafer 10 or t60 at the injection energy E1, the surface resistivities Rs of the measuring wafers 10 and 60 both result in a minimum value Rs1.

On the other hand, now consider that malfunctions occur in the respective parts of the ion implantation device 200 and consequently the ion implantation device 200 implants the impurity 70 in the measuring wafer 10 or 60 at the injection energy E2. A point X2 is a point lying on the solid line a corresponding to the injection energy E2 where the measuring wafer is of the conventionally used measuring wafer 10. A surface resistivity Rs2 is of surface resistivity corresponding to the point X2. The surface resistivity Rs2 results in a measured value of surface resistivity Rs of an area (i.e., the neighborhood of the surface of Si wafer 12) used as the conductive layer of the measuring wafer 10. A point X2' is a point lying on the solid line b corresponding to the injection energy E2 where the measuring wafer corresponds to the measuring wafer 60 employed in the present invention. A surface resistivity Rs2' is of surface resistivity Rs corresponding to the point X2'. The surface resistivity Rs2' results in a measured value of surface resistivity Rs of an area (i.e., SOI layer 66) used as the conductive layer of the measuring wafer 60. Thus, when the impurity 70 is injected into the measuring wafer 10 or 60 at the injection energy E2, the surface resistivity Rs of the measuring wafer 10 results in a measured value Rs2, and the surface resistivity Rs of the measuring wafer 60 results in a measured value Rs2'.

Figure 12:
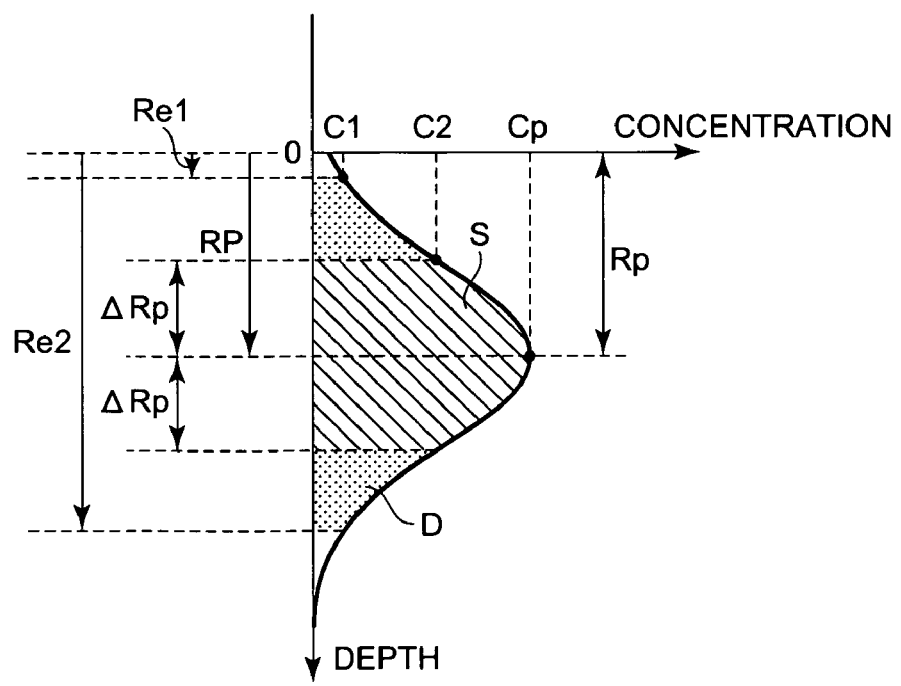
FIG. 12 is a view illustrating an impurity concentration profile.

Thus, when the injection energy E is brought to the set value E1, the surface resistivity Rs becomes minimal. When the injection energy E becomes greater or smaller than the set value E1, the surface resistivity Rs increases. When the measuring wafer is of the measuring wafer 60 employed in the present invention, it greatly increases in the surface resistivity Rs where the injection energy E becomes larger or smaller than the set value E1. Therefore, such a tendency comes to the fore. Such a tendency appears as shown in FIGS. 5 and 12 because when the injection energy E is brought to the set value E1, the concentration peak depth Rp of the impurity 70 substantially coincides with the center C in the thickness direction, of the area (SOI layer 66) used as the conductive layer of the measuring wafer 60, and the concentration peak depth Rp of the impurity 70 does not coincide with the center C at other than it.

Let's now assume that the allowable value of the surface resistivity Rs is Rs3. A point X3 is a point lying on the solid line a corresponding to a surface resistivity Rs3 at the time that the measuring wafer is of the conventionally used measuring wafer 10. An injection energy E3 is of injection energy E corresponding to the point X3. A point X3' is a point lying on the solid line b corresponding to a surface resistivity Rs3' where the measuring wafer is of the measuring wafer 60 employed in the present invention. An injection energy E3' is of injection energy E corresponding to the point X3'.

The amount of correction of the injection energy E can be calculated based on the relationship between the measured value (Rs2 or Rs2') of the surface resistivity and the allowable value (Rs3).

When, for example, the measuring wafer is of the conventionally used measuring wafer 10 and the measured value Rs2 of the surface resistivity is larger than the allowable value Rs3, the control device 100 first calculates a measured value E2 of injection energy corresponding to the measured value Rs2 of the surface resistivity, and an allowable value E3 of injection energy corresponding to the allowable value Rs3. Next, the control device 100 determines whether the measured value E2 of injection energy is larger than the allowable value E3. This decision can be done by measuring, in advance, surface resistivities Rs of plural measuring wafers 10 in which the impurity 70 has been injected and whose Si layers 12 and oxide films (SiO$_2$) 14 are different in thickness, and referring to the results of measurements. And when the measured value E2 of injection energy is larger than the allowable value E3, the control device 100 calculates the amount of correction of the injection energy E as (E2−E3) (see FIG. 6). When the measured value E2 of injection energy is smaller than the allowable value E3 in reverse, the control device 100 calculates the amount of correction of the injection energy E as (E3−E2).

When the measuring wafer is of the measuring wafer 60 employed in the present invention and the measured value Rs2' of the surface resistivity Rs is larger than the allowable value Rs3, the control device 100 first calculates a measured value E2 of injection energy corresponding to the measured value Rs2' of the surface resistivity Rs, and an allowable value E3' of injection energy corresponding to the allowable value Rs3. Next, the control device 100 makes a decision as to whether the measured value E2 of injection energy is larger than the allowable value E3'. This decision can be done by measuring, in advance, surface resistivities Rs of plural measuring wafers 60 in which the impurity 70 has been injected and whose SOI layers 66 and second oxide films ($SiO_2$ 68) are different in thickness, and referring to the results of measurements. And when the measured value E2 of injection energy is larger than the allowable value E3', the control device 100 calculates the amount of correction of the injection energy E as (E2−E3') (see FIG. 6). When the measured value E2 of injection energy is smaller than the allowable value E3' in reverse, the control device 100 calculates the amount of correction of the injection energy E as (E3'−E2).

Incidentally, as shown in FIG. 6, the measured value Rs2' of the surface resistivity of the measuring wafer 60 becomes larger in difference than the measured value Rs2 of the surface resistivity of the measuring wafer 10 as viewed from the allowable value Rs3. Therefore, the present invention is capable of accurately detecting the implantation depth of the impurity 70 than conventional. The allowable value E3' of the injection energy E where the measuring wafer 60 is intended for injection, becomes smaller than the allowable value E3 of the injection energy in difference as viewed from the set value E1 where the measuring wafer 10 is intended for injection. Therefore, the present invention is capable of correcting the injection energy E to a value closer to the set value E1.

<As to Various Data>

Various data handled by the control device 100 will be explained below. The various data handled by the control device 100 include, for example, data indicative of a relationship between injection energy E and surface resistivity Rs, data indicative of a relationship between injection energy E and an impurity concentration profile, etc. These are led out according to various conditions (e.g., injection energy E, the type of impurity 70, the dose of the impurity 70, the type of target to be injected, etc.).

The data indicative of the relationships between the injection energy E and the surface resistivity Rs are shown in Tables 1 and 2. Tables 1 and 2 show data where the impurity 70 is implanted in a target to be implanted and subjected to heat treatment at about 1000° C. for ten seconds.

TABLE 1

| Injection energy E | 10 | 20 | 30 | 40 | 50 | 60 | 70 | 80 | (keV) |
|---|---|---|---|---|---|---|---|---|---|
| Surface resistivity Rs | 161.5 | 146.2 | 162.5 | 192.8 | 237.3 | 291.7 | 379.4 | 477.1 | (Ω/sq) |

TABLE 2

| Injection energy E | 10 | 20 | 30 | 40 | 50 | 60 | 70 | 80 | (keV) |
|---|---|---|---|---|---|---|---|---|---|
| Surface resistivity Rs | 957.3 | 773 | 451.4 | 139.7 | 138.6 | 144.3 | 153.8 | 173.3 | (Ω/sq) |

TABLE 3

| Injection energy E | 50 | 100 | (keV) |
|---|---|---|---|
| Implantation depth RP | 600 | 1030 | (Å) |
| Diffusion variation ΔRp | 280 | 360 | (Å) |

In the example shown in Table 1, the type of impurity 70 is assumed to be P, the dose of the impurity 70 is assumed to be $5 \times 10^{15} cm^{-2}$, the target to be injected is assumed to be the SOI wafer 60 (however, on condition that the number of defects on the surface is a predetermined value or less fixed in advance), the thickness of the second oxide film ($SiO_2$) 68 is assumed to be 100 Å, and the thickness of the SOI layer 66 is assumed to be 250 Å. When the injection energy is about 20 keV in the example shown in Table 1, the concentration peak depth Rp of the impurity 70 coincides with approximately the center C of the SOI layer 66 as viewed in its thickness direction.

In the example shown in Table 2, the type of impurity 70 is assumed to be P, the dose of the impurity 70 is assumed to be $5 \times 10^{15} cm^{-2}$, the target to be injected is assumed to be the SOI wafer 60 (however, on condition that the number of defects on the surface is a predetermined value or less defined in advance), the thickness of the second oxide film ($SiO_2$) 68 is assumed to be 450∈, and the thickness of the SOI layer 66 is assumed to be 300∈. When the injection energy is about 50 keV in the example shown in Table 2, the concentration peak depth Rp of the impurity 70 coincides with approximately the center C of the SOI layer 66 as viewed in its thickness direction.

Data indicative of the relationship between injection energy E and an impurity concentration profile are shown in Table 3. Table 3 shows data where an impurity 70 is implanted in a target to be implanted and subjected to heat treatment at about 950° C. for ten seconds.

In the example shown in Table 3, the type of impurity 70 is assumed to be P, the dose of the impurity 70 is assumed to be $5 \times 10^{15} cm^{-2}$, and a target to be implanted is assumed to be the SOI wafer 60 (however, on condition that the number of defects on the surface is a predetermined value or less defined in advance). When the injection energy is 50 keV in the example shown in Table 3, the implantation depth RP of the impurity 70 results in about 600 Å and its diffusion variation width ΔRp results in about 280 Å. When the injection energy is 100 keV, the injection depth RP of the impurity 70 reaches about 1030 Å and its diffusion variation width ΔRp reaches about 360 Å.

First Preferred Embodiment

Respective preferred embodiments of the present invention will be explained below. In the respective embodiments, an SOI wafer is used as a measuring wafer 60, and phosphorous (P) is used as an impurity 70.

FIG. 7 is a view for describing a processing process according to a first embodiment. In order to explain the measuring wafer 60 employed in the first embodiment and the conventionally used measuring wafer 10 by comparison in FIG. 7, the measuring wafer employed in the first embodiment is referred to as "SOI wafer 60", and the conventionally used measuring wafer is referred to as "bulk Si wafer 10".

Figure 7A:
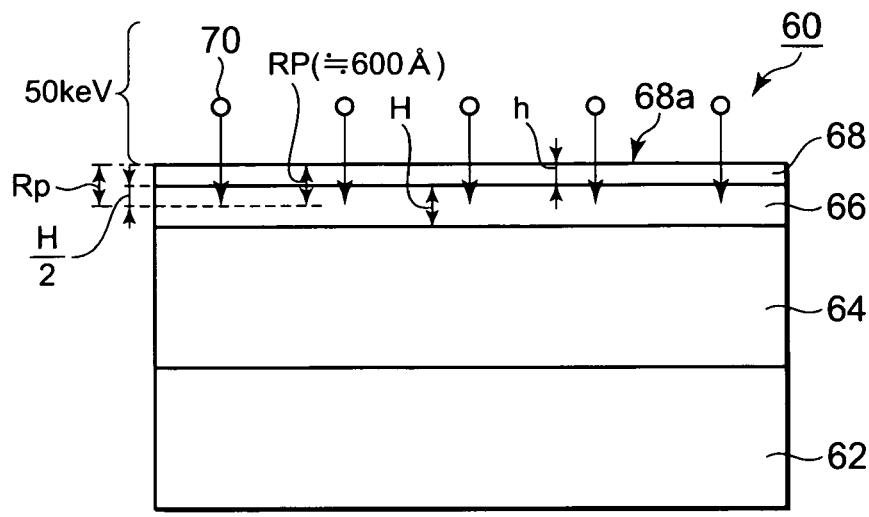
FIGS. 7A through 7C are views for describing a processing process according to a first embodiment.
Figure 7B:
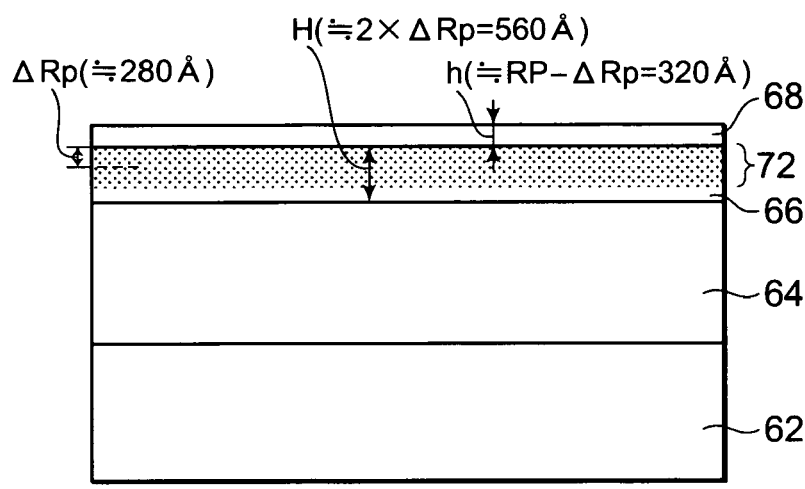

The first embodiment will be explained below with reference to FIG. 7A. The ion implantation device 200 first accelerates the impurity 70 at injection energy E set such that the impurity 70 is implanted to a set value RP of an implantation depth and injects the impurity 70 into the SOI wafer 60 from above a second oxide film 68. Incidentally, the injection energy E is set in consideration of the thickness of the second oxide film 68 formed on its corresponding SOI layer 66, in such a manner that the impurity 70 is sufficiently implanted in the SOI layer 66. In the present embodiment, the injection energy E is assumed to be 50 keV. When the injection energy E is set to 50 keV, the type of impurity 70 is set to P, the dose of the impurity 70 is set to $5 \times 10^{15} cm^{-2}$, and a target to be implanted is set to the SOI wafer 60 (however, on condition that the number of defects is less than or equal to a predetermined value defined in advance), the set value RP of the implantation depth of the impurity 70 results in about 600Å, and its diffusion variation width ΔRp results in about 280Å. Such data have been measured by experiment in advance.

The impurity 70 injected into the SOI wafer 60 collides with an internal crystal of the measuring wafer 60 and proceeds while being scattered, and stops at a point where the injection energy E is used up. At this time, the implanted impurity 70 is focused on and stopped at an area of about (Rp±ΔRp) for the most part with the neighborhood of a concentration peak depth Rp as the peak. If no malfunctions occur in the respective parts (e.g., an acceleration part, etc.) of the ion implantation device 200 here, then the concentration peak depth Rp coincides with the set value RP of the implantation depth. Thus, if no malfunctions occur in the respective parts (e.g., the acceleration part, etc.) of the ion implantation device 200, then the implanted impurity 70 is focused on and stopped at an area of about (RP±ΔRp) for the most part with the set value RP of the implantation depth as the peak. Described specifically, the implanted impurity 70 is focused on and stopped at an area of about (600±280) Å for the most part with the neighborhood of about 600 Å as viewed from an upper surface 68a of the second oxide film 68 as the peak. Incidentally, the area of about (600±280) Å exists inside the SOI layer 66. Accordingly, if no malfunctions occur in the respective parts (e.g., the acceleration part, etc.) of the ion implantation device 200, then the implanted impurity 70 is implanted in the SOI layer 66 for the most part. Thus, the ion implantation device 200 forms an impurity-implanted layer 72 with the impurity 70 injected therein in the SOI layer 66 (see FIG. 7B).

Next, the ion implantation device 200 effects heat treatment on the whole SOI wafer 60 at about 950° C. to activate the impurity 70 of the impurity-implanted layer 72. With the activation of the impurity 70, an impurity active layer 74 is formed from the impurity-implanted layer 72 (see FIG. 7C). The impurity active layer 74 is a conductive layer. And the ion implantation device 200 removes the second oxide film 68 from the SOI wafer 60 to expose the impurity active layer 74.

Thereafter, the measurement device 300 measures surface resistivity Rs of the SOI wafer 60 by a four probe method or the like.

The surface resistivity Rs of the SOI wafer 60 reaches a minimum if the concentration peak depth Rp of the impurity 70 is in the neighborhood of the set value RP of the implantation depth. This is because the substantial dose of the impurity 70 reaches a maximum.

However, when the concentration peak depth Rp of the impurity 70 falls outside the set value RP of the implantation depth, the surface resistivity Rs of the SOI wafer 60 significantly increases as compared with the conventional bulk Si wafer 10. This is because the implanted impurity 70 is implanted in an area (i.e., first oxide film 64 or second oxide film 68) out of the conductive layer for the most part, so that the substantial dose of the impurity 70 is significantly reduced.

When, for example, the injection energy E is assumed to be 50 keV, the type of impurity 70 is assumed to be P, the dose of the impurity 70 is assumed to be $5 \times 10^{15} cm^{-2}$, and a target to be implanted is assumed to be the SOI wafer 60, the substantial dose (i.e., dose of the impurity 70 implanted in the SOI layer 66 used as the conductive layer) of the impurity 70 reaches about 3% with only a displacement of the concentration peak depth Rp, equivalent to about twice (i.e., about 560 Å) the diffusion variation width ΔRp from the set value RP of the implantation depth. As a result, the surface resistivity Rs of the SOI wafer 60 increases any order of magnitude.

Thus, in the first embodiment, when the concentration peak depth Rp of the impurity 70 falls outside the set value RP of the implantation depth, its influence noticeably appears as a marked increase in the surface resistivity Rs. According to the first embodiment from this point of view, the SOI wafer 60 is used as the measuring wafer and the thickness H of the SOI layer 66 formed as the conductive layer is set to, for example, approximately twice (i.e., about 560 Å) the diffusion variation width ΔRp. Thus, a variation in the concentration peak depth Rp of the impurity 70 can accurately be detected as compared with the conventional method.

Incidentally, the SOI wafer 60 is set in such a manner that assuming that the thickness H of the SOI layer 66 used as the conductive layer is about twice the diffusion variation width ΔRp, the concentration peak depth Rp coincides with the center C of the conductive layer where the thickness h of the second oxide film 68 reaches (RP−ΔRp). That is, the SOI wafer 60 is set in such a manner that assuming that the thickness H of the SOI layer 66 used as the conductive layer is (280×2)=560 Å, the concentration peak depth Rp coincides with the center C of the conductive layer where the thickness h of the second oxide film 68 reaches (600−280)= 320 Å.

According to the first embodiment as mentioned above, the second oxide film 68 is formed on the SOI layer 68, and the thickness H of the SOI layer 66 is set to about twice the diffusion variation width ΔRp. It is therefore possible to measure the variation in the concentration peak depth Rp of the impurity 70 with good sensitivity.

Second Preferred Embodiment

FIG. 8 is a view for describing a processing process according to a second embodiment. In the second embodiment, injection energy E is set higher than the first embodiment. Correspondingly, the thickness of a second oxide film 68 is formed thicker than the first embodiment. Incidentally, the thickness of the second oxide film 68 is set to such a thickness as not only to suppress outward diffusion of an impurity 70 but also to enable cutting of a base area of a concentration profile of the impurity 70.

Figure 8A:
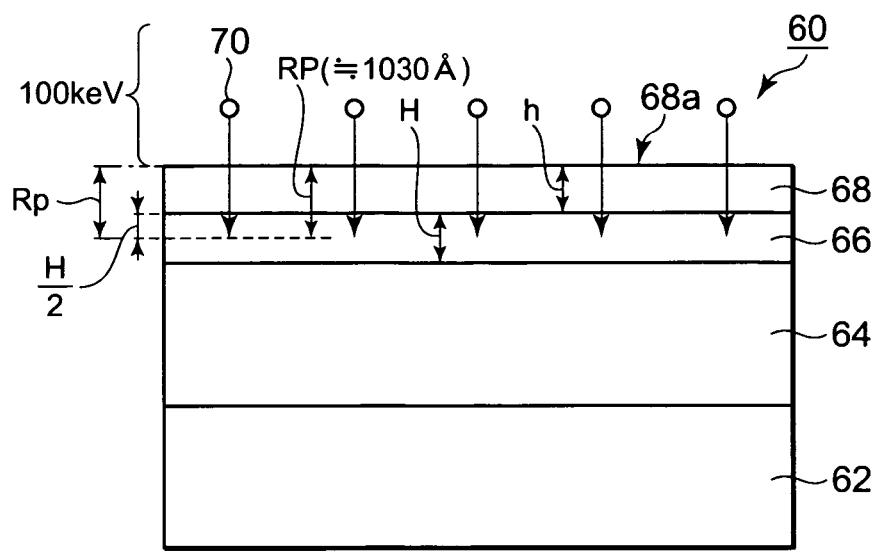
FIGS. 8A through 8C are views for explaining a processing process according to a second embodiment.
Figure 8B:
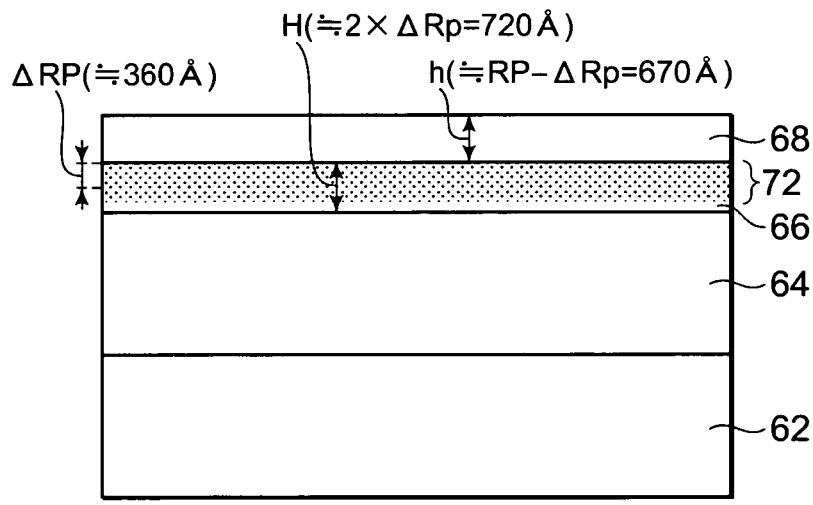

The second embodiment will be explained below with reference to FIG. 8A. The ion implantation device 200 first accelerates the impurity 70 at injection energy E set such that the impurity 70 is implanted to a set value RP of its implantation depth and implants the impurity 70 in its corresponding SOI wafer 60 from above a second oxide film 68. Incidentally, the injection energy E is set in consideration of the thickness of the second oxide film 68 formed on its corresponding SOI layer 66, in such a manner that the impurity 70 is sufficiently implanted in the SOI layer 66. In the present embodiment, the injection energy E is assumed to be 100 keV. When the injection energy E is set to 100 keV, the type of impurity 70 is set to P, the dose of the impurity 70 is set to $5 \times 10^{15}$ cm$^{-2}$, and a target to be implanted is set to the SOI wafer 60 (however, on condition that the number of defects is less than or equal to a predetermined value defined in advance), the set value RP of the implantation depth of the impurity 70 results in about 1030 Å, and its diffusion variation width ΔRp results in about 360 Å. Such data have been measured by experiment in advance.

The impurity 70 injected into the SOI wafer 60 collides with an internal crystal of the measuring wafer 60 and proceeds while being scattered, and stops at a point where the injection energy E is used up. At this time, the implanted impurity 70 is focused on and stopped at an area of about (Rp±ΔRp) for the most part with the neighborhood of a concentration peak depth Rp as the peak. If no malfunctions occur in the respective parts (e.g., an acceleration part, etc.) of the ion implantation device 200 here, then the concentration peak depth Rp coincides with the set value RP of the implantation depth. Thus, if no malfunctions occur in the respective parts (e.g., the acceleration part, etc.) of the ion implantation device 200, then the implanted impurity 70 is focused on and stopped at an area of about (RP±ΔRp) for the most part with the set value RP of the implantation depth as the peak. Described specifically, the implanted impurity 70 is focused on and stopped at an area of about (1030±360) Å for the most part with the neighborhood of about 1030 Å as viewed from an upper surface 68a of the second oxide film 68 as the peak. Incidentally, the area of about (1030±360)Å exists inside the SOI layer 66. Accordingly, if no malfunctions occur in the respective parts (e.g., the acceleration part, etc.) of the ion implantation device 200, then the implanted impurity 70 is implanted in the SOI layer 66 for the most part. Thus, the ion implantation device 200 forms an impurity-implanted layer 72 with the impurity 70 injected therein in the SOI layer 66 (see FIG. 8B).

Next, the ion implantation device 200 effects heat treatment on the whole SOI wafer 60 at about 950° C. to activate the impurity 70 of the impurity-implanted layer 72. With the activation of the impurity 70, an impurity active layer 74 is formed from the impurity-implanted layer 72 (see FIG. 8C).

The impurity active layer 74 is a conductive layer. And the ion implantation device 200 removes the second oxide film 68 from the SOI wafer 60 to expose the impurity active layer 74.

Thereafter, the measurement device 300 measures surface resistivity Rs of the SOI wafer 60 by a four probe method or the like.

When the injection energy E is assumed to be 100 keV, the type of impurity 70 is assumed to be P, the dose of the impurity 70 is assumed to be $5 \times 10^{15}$ cm$^{-2}$, and a target intended for implantation is assumed to be the SOI wafer 60 as in the second embodiment, the substantial dose (i.e., dose of the impurity 70 implanted in the SOI layer 66 used as the conductive layer) of the impurity 70 reaches about 3% with only a displacement of the concentration peak depth Rp, equivalent to about twice (i.e., about 720 Å) the diffusion variation width ΔRp from the set value RP of the implantation depth. As a result, the surface resistivity Rs of the SOI wafer 60 increases any order of magnitude.

Thus, in the second embodiment, when the concentration peak depth Rp of the impurity 70 falls outside the set value RP of the implantation depth, its influence noticeably appears as a marked increase in the surface resistivity Rs. According to the second embodiment from this point of view, the SOI wafer 60 is used as the measuring wafer and the thickness H of the SOI layer 66 formed as the conductive layer is set to, for example, approximately twice (i.e., about 720 Å) the diffusion variation width ΔRp. Thus, a variation in the concentration peak depth Rp of the impurity 70 can accurately be detected as compared with the conventional method.

Incidentally, the SOI wafer 60 is set in such a manner that assuming that the thickness H of the SOI layer 66 used as the conductive layer is about twice the diffusion variation width ΔRp, the concentration peak depth Rp coincides with the center C of the conductive layer where the thickness h of the second oxide film 68 reaches (RP−ΔRp). That is, the SOI wafer 60 is set in such a manner that assuming that the thickness H of the SOI layer 66 used as the conductive layer is (360×2)=720 Å, the concentration peak depth Rp coincides with the center C of the conductive layer where the thickness h of the second oxide film 68 reaches (1030−360)= 670 Å.

In such a second embodiment, the thickness of the second oxide film 68 is set to such a thickness of (RP−ΔRp) that it results in the base area of the concentration profile of the impurity 70 where the impurity 70 is implanted in the SOI wafer 60 at injection energy E larger than that employed in the first embodiment. Consequently, a variation in the concentration peak depth Rp of the impurity 70 can be measured with good sensitivity.

According to the second embodiment as described above, the thickness of the second oxide film 68 formed on the SOI layer 66 used as the conductive layer is set in accordance with the value of the injection energy E, whereby the variation in the concentration peak depth Rp of the impurity 70 can be measured with good sensitivity.

Third Preferred Embodiment

FIG. 9 is a view for describing a processing process according to a third embodiment. In the third embodiment, a TEG pattern (Test Element Group pattern) for measuring a concentration peak depth Rp of an impurity 70 is formed on an SOI wafer 60 with the impurity 70 injected therein.

Figure 7C:
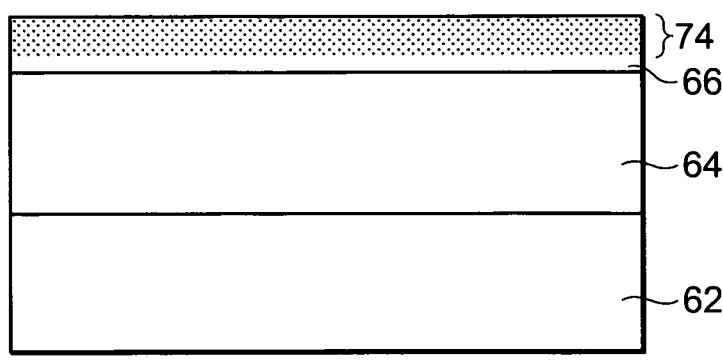
Figure 8C:
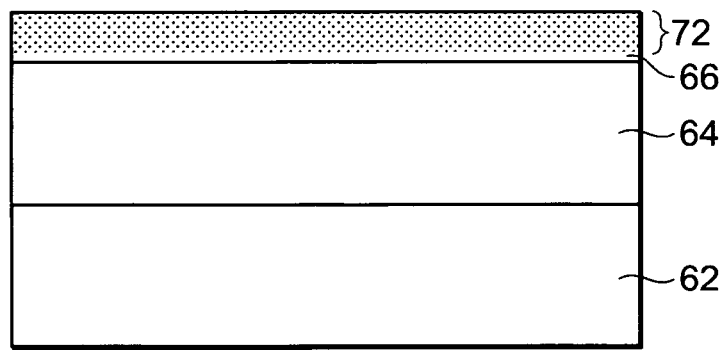
Figure 9A:
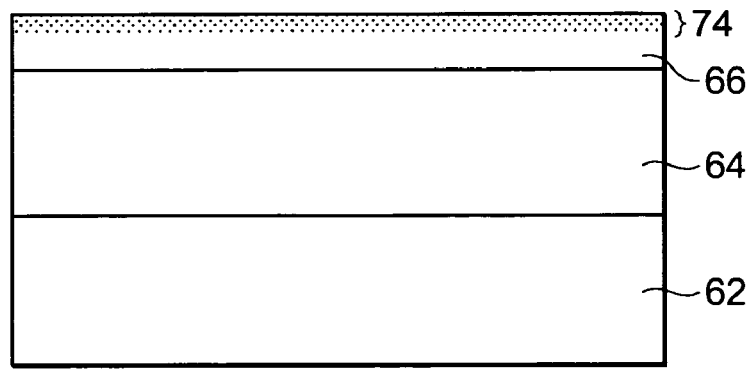
FIGS. 9A through 9C are views for describing a processing process according to a third embodiment.
Figure 9B:
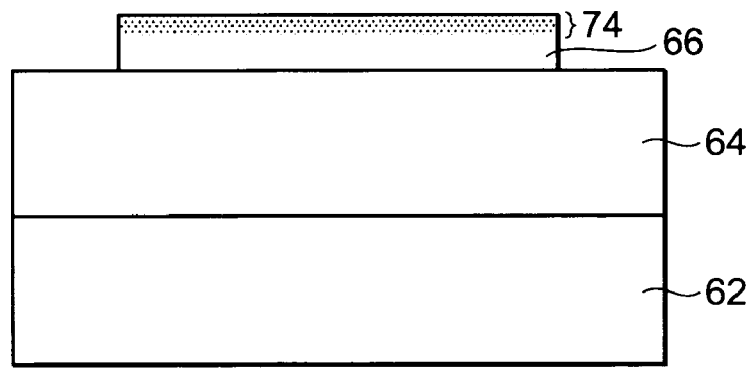
Figure 9C:
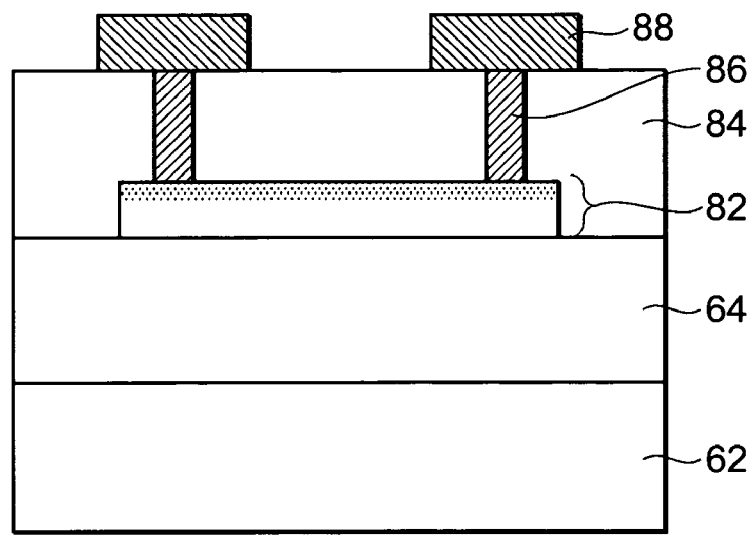

FIG. 9A shows the SOI wafer 60 subsequent to being subjected to the process (i.e., the oxide film removing process of S105) described with reference to FIGS. 7C and 8C.

The ion implantation device 200 effects photolithography processing and etching processing on an SOI layer 66 to form a TEG pattern 82. Thus, the ion implantation device 200 forms the TEG pattern 82 on a main surface of the SOI wafer 60 by using the SOI layer 66 (see FIG. 9B).

Next, the ion implantation device 200 forms an interlayer insulating film 84 and thereafter forms contacts 86 and wirings 88 on the TEG pattern 82. Thus, the TEG pattern 82 is made electrically conductive to the wirings 88 (see FIG. 9C).

Thereafter, the measurement device 300 measures a resistance characteristic (surface resistivity Rs or the like) and transistor characteristics (threshold value and current value or the like) of the SOI wafer 60 through the TEG pattern 82.

Such a third embodiment is capable of measuring not only the resistance characteristic but also the transistor characteristics or the like. Therefore, the third embodiment is able to not only evaluate the SOI wafer 60 on the basis of a simple analysis on only the resistance characteristic but also evaluate the SOI wafer 60 on the basis of a combined analysis of the resistance characteristic and the transistor characteristics. Thus, the third embodiment is capable of analyzing a concentration profile of the impurity 70 at the SOI wafer 60 with high accuracy after having passed through respective process steps such as impurity implantation, heat treatment, oxide film removal, etc.

According to the third embodiment as described above, the TEG pattern 82 is formed on its corresponding main surface of the SOI wafer 60 by using the SOI layer 66 formed on the SOI wafer 60 for fabricating the semiconductor device in the first or second embodiment. Thus, it is possible to analyze the concentration profile of the impurity 70 at the SOI wafer 60 with high accuracy after having passed through the respective process steps such as the impurity injection, heat treatment, the removal of the oxide film, etc.

Incidentally, the recent semiconductor device has been designed in extremely fine form. Therefore, a variation in the concentration profile of the impurity 70 exerts a large influence on the characteristics of the semiconductor device. Accordingly, the high-accuracy analysis of the concentration profile of the impurity 70 by the third embodiment is important in checking of the characteristics of the semiconductor device.

The present invention is not limited to the above embodiments and examples. It is considered that various applications and modifications can be made within the scope not departing from the gist of the present invention.

For example, the first through third embodiments make use of the SOI wafer 60 in which the Si layer is formed on the SiO₂ layer. However, the present invention may use a wafer formed of other material if such a structure that a thin conductive layer is interposed in an insulating film is taken. For example, the wafers described with reference to FIGS. 1B through 1D may be used.

What is claimed is:

1. A method for measuring an implantation depth of an impurity injected into a wafer by an ion implantation device, using a measurement device and monitoring whether the measured implantation depth of impurity falls within an allowable range, comprising the steps of:

using, as a measuring wafer, a wafer having an insulating film and an Si layer formed on the insulating film with a thickness of a 1000 Å unit or less;

implanting the impurity in the measuring wafer from above the surface of the Si layer, corresponding to a main surface of the measuring wafer and heat-treating the measuring wafer; and measuring surface resistivity of the main surface of the heat-treated measuring wafer by the measurement device and detecting, as an implantation depth of the impurity from the main surface, a concentration peak depth from the main surface, which corresponds to the surface resistivity and at which a concentration of the impurity implanted in the measuring wafer reaches a peak.

2. The method according to claim 1, wherein when a diffusion variation width in the direction of the implantation depth of the impurity is defined as $\Delta Rp$, a wafer in which the thickness of the Si layer is defined as $2 \times \Delta Rp \times (1 \pm 0.1)$, is used as the measuring wafer.

3. The method according to claim 2, wherein a wafer in which an oxide film is formed on the Si layer, is used as the measuring wafer.

4. The method according to claim 3, wherein when a set value of the implantation depth of the impurity is defined as RP, a wafer in which the thickness of the oxide film is defined as $(RP-\Delta Rp) \times (1 \pm 0.1)$, is used as the measuring wafer.

5. The method according to claim 1, comprising the steps of:

forming a TEG pattern on the insulating film, using the Si layer after the heat treatment and before the measurement of the surface resistivity; and measuring surface resistivity of the measuring wafer formed with the TEG pattern.

6. The method according to claim 1, wherein an SOI wafer in which the insulating film is formed as an SiO₂ layer, is used as the measuring wafer.

7. The method according to claim 1, wherein a wafer in which the insulating film is formed as an SiO₂ layer having through holes, is used as the measuring wafer.

8. The method according to claim 1, wherein an SOS wafer in which the insulating film is formed as an Al₂O₃ layer, is used as the measuring wafer.

9. The method according to claim 1, wherein an SOQ wafer in which the insulating film is formed as a quartz layer, is used as the measuring wafer.

* * * * *